(12) United States Patent
Matsumoto

(10) Patent No.: US 10,269,532 B2
(45) Date of Patent: Apr. 23, 2019

(54) MULTI CHARGED PARTICLE BEAM EXPOSURE METHOD, AND MULTI CHARGED PARTICLE BEAM EXPOSURE APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc, Yokohama-shi (JP)

( * ) Notice: Subject to any disclaimer, the term of this patent is extended or adjusted under 35 U.S.C. 154(b) by 42 days.

(21) Appl. No.: 15/605,343

(22) Filed: May 25, 2017

(65) Prior Publication Data

US 2017/0352520 A1 Dec. 7, 2017

(30) Foreign Application Priority Data

Jun. 3, 2016 (JP) ................................. 2016-111997

(51) Int. Cl.
| | | |
|---|---|---|
| *H01J 37/147* | (2006.01) | |
| *H01J 37/30* | (2006.01) | |
| *H01J 37/04* | (2006.01) | |
| *H01J 37/10* | (2006.01) | |

(Continued)

(52) U.S. Cl.
CPC ........ *H01J 37/1471* (2013.01); *H01J 37/045* (2013.01); *H01J 37/10* (2013.01); *H01J 37/3007* (2013.01); *H01J 37/3026* (2013.01); *H01J 37/3177* (2013.01); *H01J 2237/0435* (2013.01); *H01J 2237/0437* (2013.01); *H01J 2237/30455* (2013.01); *H01J 2237/31774* (2013.01)

(58) Field of Classification Search
CPC ...... H01J 37/1471; H01J 37/045; H01J 37/10; H01J 37/3007; H01J 2237/0435; H01J 2237/30455; H01J 2237/31774
USPC ......... 250/396 R, 397, 492.1, 492.2, 492.21, 250/492.22, 492.23, 492.3
See application file for complete search history.

(56) References Cited

U.S. PATENT DOCUMENTS

| | | | | |
|---|---|---|---|---|
| 9,287,090 B2* | 3/2016 | Yoshikawa | ......... | H01J 37/3177 |
| 2003/0025088 A1* | 2/2003 | Oae | ........................ | B82Y 10/00 |
| | | | | 250/492.23 |

(Continued)

FOREIGN PATENT DOCUMENTS

JP 10-289841 10/1998

*Primary Examiner* — Nicole M Ippolito
(74) *Attorney, Agent, or Firm* — Oblon, McClelland, Maier & Neustadt, L.L.P.

(57) ABSTRACT

A multi charged particle beams exposure method includes assigning, with respect to plural times of shots of multi-beams using a charged particle beam, each shot to one of plural groups, depending on a total current value of beams becoming in an ON condition in a shot concerned in the multi-beams, changing the order of the plural times of shots so that shots assigned to the same group may be continuously emitted for each of the plural groups, correcting, for each group, a focus position of the multi-beams to a focus correction position for a group concerned corresponding to the total current value, and performing the plural times of shots of the multi-beams such that the shots assigned to the same group are continuously emitted in a state where the focus position of the multi-beams has been corrected to the focus correction position for the group concerned.

10 Claims, 17 Drawing Sheets

(51) Int. Cl.
*H01J 37/302* (2006.01)
*H01J 37/317* (2006.01)

(56) References Cited

U.S. PATENT DOCUMENTS

2010/0038554 A1* 2/2010 Platzgummer ......... B82Y 10/00
  250/397
2016/0111252 A1* 4/2016 Motosugi ............ H01J 37/3045
  250/398

* cited by examiner

| No. | k' | tk' |
|---|---|---|
| 1 | 9 | 512Δ |
| 2 | 8 | 256Δ |
| 3 | 7 | 128Δ |
| 4 | 6 | 64Δ |
| 5 | 5 | 32Δ |
| 6 | 4 | 16Δ |
| 7 | 3 | 8Δ |
| 8 | 2 | 4Δ |
| 9 | 1 | 2Δ |
| 10 | 0 | Δ |

FIG.9

| ΔI'/Imax | ΔF | Δx | Δy |
|---|---|---|---|
| 0 | 0 | ... | ... |
| 0.25 | 0.5 | ... | ... |
| 0.5 | 1.0 | ... | ... |
| 0.75 | 1.5 | ... | ... |

FIG.14

MULTI CHARGED PARTICLE BEAM EXPOSURE METHOD, AND MULTI CHARGED PARTICLE BEAM EXPOSURE APPARATUS

CROSS-REFERENCE TO RELATED APPLICATION

This application is based upon and claims the benefit of priority from the prior Japanese Patent Application No. 2016-111997 filed on Jun. 3, 2016 in Japan, the entire contents of which are incorporated herein by reference.

BACKGROUND OF THE INVENTION

Field of the Invention

Embodiments of the present invention relate generally to a multi charged particle beam exposure method, and a multi charged particle beam exposure apparatus, and more specifically, relate to a beam irradiation method in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" with electron beams on a wafer, etc.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system, and deflects the beam by a deflector to irradiate a desired position on a target object or "sample".

In the electron beam writing, there is a problem in that, when the current amount of a beam to be shot increases, the focus position of a beam image deviates due to the Coulomb effect, resulting in generating so-called blurring. Therefore, in a writing apparatus using a single beam of the variable shaped beam (VSB) system, it has been conventionally proposed to correct, for each shot, the focus position of a beam in accordance with the current amount (e.g., refer to Japanese Patent Application Laid-open (JP-A) No. 10-289841). Also, in multi-beam writing, there is a problem in that, if the total current amount of multi-beams simultaneously irradiated increases, the focus position of a multi-beam image deviates due to the Coulomb effect, resulting in generating so-called blurring because of the focus deviation.

In multi-beam writing, controlling of the dose emitted onto an irradiation position is performed by individually controlling the irradiation time of each beam. As a first control method, it has been proposed that a counter circuit is provided for each beam to adjust the irradiation time of each beam during one shot (during an exposure period). As a second control method, it has been proposed that adjustment of the irradiation time of each beam is achieved by dividing one shot having a maximum irradiation time per one shot into a plurality of sub-shots each having a different irradiation time, selecting a set of sub-shots in all the sub-shots corresponding to the irradiation time of one shot which may not have the maximum irradiation time per one shot, and executing the set of sub-shots. However, in the first control method, since the irradiation time of each beam during one shot (during an exposure period) is different from each other, the current amount of the entire ON beams varies during one shot (during an exposure period). Therefore, it is difficult to correct the focus position of the multi-beams for each shot. On the other hand, in the second control method, the current amount of the entire ON beams of each sub-shot can be a fixed amount. However, in order to change the focus position of the multi-beams, settling time of the control amplifier is required each time. Therefore, if the focus position change is performed for each sub-shot, the number of times of refocusing becomes enormous, thereby degrading the throughput. Thus, while improvement of throughput is aimed by multi-beam writing, it is difficult to sufficiently achieve the effect.

BRIEF SUMMARY OF THE INVENTION

According to one aspect of the present invention, a multi charged particle beams exposure method includes assigning, with respect to a plurality of times of shots of multi-beams using a charged particle beam, each shot to one of a plurality of groups, depending on a total current value of beams becoming in an ON condition in a shot concerned in the multi-beams, changing an order of the plurality of times of shots so that shots assigned to a same group are continuously emitted for each of the plurality of groups, correcting, for each group, a focus position of the multi-beams to a focus correction position for a group concerned corresponding to the total current value, and
performing the plurality of times of shots of the multi-beams such that the shots assigned to the same group are continuously emitted in a state where the focus position of the multi-beams has been corrected to the focus correction position for the group concerned.

According to another aspect of the present invention, a multi charged particle beams exposure apparatus includes an emission source configured to emit a charged particle beam, a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings, a blanking aperture array mechanism, including a substrate in which a plurality of second openings are formed, and a plurality of electrodes arranged at the substrate so as to be opposite each other with respect to a corresponding one of the plurality of second openings, configured to individually perform blanking deflection for each beam of the multi-beams by using the plurality of electrodes, a limiting aperture substrate configured to block a beam having been blanking-deflected to be in an OFF condition, an objective lens configured to focus the multi-beams on a target object, an assignment circuit configured to assign, with respect to a plurality of times of shots of the multi-beams, each shot to one of a plurality of groups, depending on a total current value of beams becoming in an ON condition in a shot concerned in the multi-beams, a shot order change circuit configured to change an order of the plurality of times of shots so that shots assigned to a same group are continuously emitted for each of the plurality of groups, and a correction lens configured to correct, for each group, a focus position of the multi-beams to a focus correction position for a group concerned corresponding to the total current value, wherein the plurality of times of shots of the multi-beams are performed such that the shots assigned to the same group are continuously emitted in a state where the focus position of the multi-beams has been corrected to the focus correction position for the group concerned.

According to yet another aspect of the present invention, a multi charged particle beams exposure apparatus includes an emission source configured to emit a charged particle beam, a shaping aperture array substrate, in which a plurality of first openings are formed, configured to form multi-beams by making a region including a whole of the plurality of first openings irradiated with the charged particle beam, and making portions of the charged particle beam individually pass through a corresponding one of the plurality of first openings, a blanking aperture array mechanism, including a substrate in which a plurality of second openings are formed, and a plurality of electrodes arranged at the substrate so as to be opposite each other with respect to a corresponding one of the plurality of second openings, configured to individually perform blanking deflection for each beam of the multi-beams by using the plurality of electrodes, a limiting aperture substrate configured to block a beam having been blanking-deflected to be in an OFF condition, an objective lens configured to focus the multi-beams on a target object, an assignment circuit configured to assign, with respect to a plurality of times of shots of the multi-beams, each shot to one of a plurality of groups, depending on a total current value of beams becoming in an ON condition in a shot concerned in the multi-beams, a shot order change circuit configured to change an order of the plurality of times of shots so that shots assigned to a same group are continuously emitted for each of the plurality of groups, and a deflector configured to correct, for each group, a focus position of the multi-beams to a focus correction position for a group concerned corresponding to the total current value, and to deflect the multi-beams, wherein the plurality of times of shots of the multi-beams are performed such that the shots assigned to the same group are continuously emitted in a state where the focus position of the multi-beams has been corrected to the focus correction position for the group concerned.

BRIEF DESCRIPTION OF THE DRAWINGS

FIG. 9 shows an example of divided shots of multi-beams according to the first embodiment;

FIG. 14 shows an example of correlation data according to the first embodiment;

DETAILED DESCRIPTION OF THE INVENTION

Hereinafter, embodiments of the present invention describe a multi charged particle beam exposure method and a multi charged particle beam exposure apparatus that can suppress focus deviation occurring because of the Coulomb effect, while reducing degradation of the throughput of multi-beam writing.

In the embodiments below, there will be described a configuration in which an electron beam is used as an example of a charged particle beam. The charged particle beam is not limited to the electron beam, and other charged particle beam such as an ion beam may also be used. Moreover, in the Embodiments, the configuration using a writing apparatus as an example of an exposure apparatus will be described. However, the exposure apparatus is not limited to the writing apparatus, and may be an exposure apparatus, such as an inspection apparatus, which irradiates a target object with charged particle beams. Moreover, in the Embodiments, that the same beam of multi beams irradiates a plurality of irradiation positions means that beams formed by the same shaping aperture of a shaping aperture array for forming multi beams individually irradiate a corresponding one of a plurality of irradiation positions.

First Embodiment

Figure 1:
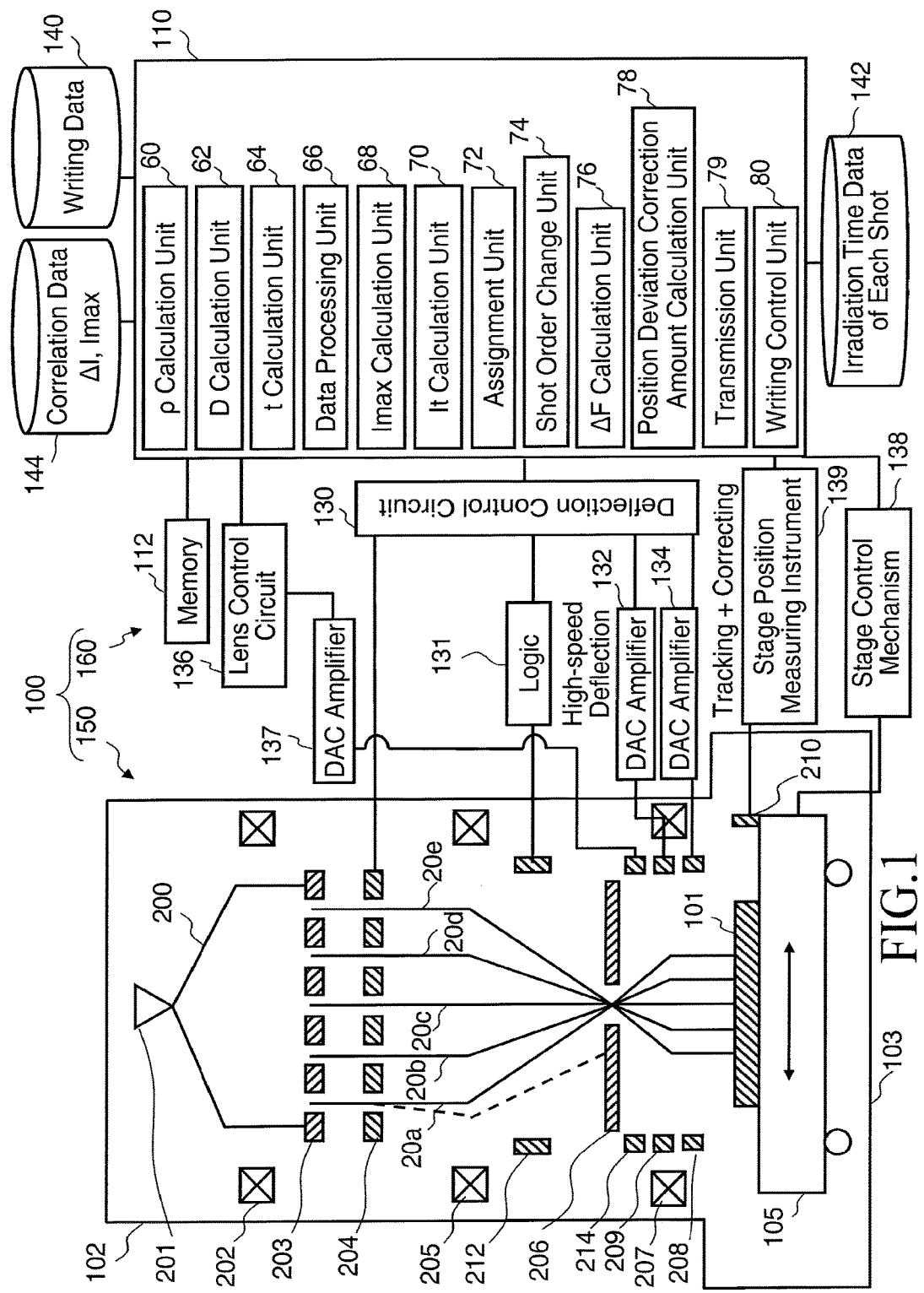
FIG. 1 is a conceptual diagram showing a configuration of a writing apparatus according to a first embodiment.

FIG. 1 is a conceptual diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi charged particle beam writing apparatus and an example of a multi charged particle beam exposure apparatus. The writing mechanism 150 includes an electron optical column 102 and a writing chamber 103. In the electron optical column 102, there are arranged an electron gun 201

(emission source), an illumination lens 202, a shaping aperture array substrate 203, a blanking aperture array mechanism 204, a reducing lens 205, a limiting aperture substrate 206, an objective lens 207, deflectors 208 and 209, a common blanking deflector 212, and an electrostatic lens 214. In the writing chamber 103, an XY stage 105 is arranged. On the XY stage 105, a target object or "sample" 101 such as a mask serving as a writing substrate is placed when writing (exposing) is performed. The target object 101 is, for example, an exposure mask used in the process of manufacturing semiconductor devices, or a semiconductor substrate (silicon wafer) on which semiconductor devices are formed. Moreover, the target object 101 may be, for example, a mask blank on which resist has been applied and nothing has yet been written. A mirror 210 for measuring the position of the XY stage 105 is placed on the XY stage 105.

The control system circuit 160 includes a control computer 110, a memory 112, a deflection control circuit 130, a logic circuit 131, DAC (digital-analog converter) amplifier circuits 132, 134 and 137, a lens control circuit 136, a stage control mechanism 138, a stage position measuring instrument 139, and storage devices 140, 142 and 144 such as magnetic disk drives. The control computer 110, the memory 112, the deflection control circuit 130, the logic circuit 131, the lens control circuit 136, the stage control mechanism 138, the stage position measuring instrument 139, and the storage devices 140, 142 and 144 are connected with each other through a bus (not shown). Writing data is input from the outside of the writing apparatus 100 to the storage device 140 (storage), and stored therein. The deflection control circuit 130 is connected to the DAC amplifier circuits 132 and 134, and the blanking aperture array mechanism 204. The DAC amplifier circuit 137 is connected to the lens control circuit 136. The output of the DAC amplifier circuit 132 is connected to the deflector 209. The output of the DAC amplifier circuit 134 is connected to the deflector 208. The output of the DAC amplifier circuit 137 is connected to the electrostatic lens 214. The output of the logic circuit 131 is connected to the common blanking deflector 212. The stage position measuring instrument 139 irradiates the mirror 210 on the XY stage 105 with a laser beam, and receives a catoptric light from the mirror 210. Then, the stage position measuring instrument 139 measures the position of the XY stage 105 by using information of the catoptric light.

In the control computer 110, there are arranged a pattern area density $\rho$ calculation unit 60, a dose D calculation unit 62, an irradiation time t calculation unit 64, a data processing unit 66, a maximum current value Imax calculation unit 68, a current value "It" calculation unit 70, an assignment unit 72, a shot order change unit 74, a refocus amount calculation unit 76, a position deviation correction amount calculation unit 78, a transmission unit 79 and a writing control unit 80. Each of the " . . . units" such as the pattern area density $\rho$ calculation unit 60, the dose D calculation unit 62, the irradiation time t calculation unit 64, the data processing unit 66, the maximum current value Imax calculation unit 68, the current value "It" calculation unit 70, the assignment unit 72, the shot order change unit 74, the refocus amount calculation unit 76, the position deviation correction amount calculation unit 78, the transmission unit 79 and the writing control unit 80 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the pattern area density $\rho$ calculation unit 60, dose D calculation unit 62, irradiation time t calculation unit 64, data processing unit 66, maximum current value Imax calculation unit 68, current value "It" calculation unit 70, assignment unit 72, shot order change unit 74, refocus amount calculation unit 76, position deviation correction amount calculation unit 78, transmission unit 79 and writing control unit 80, and data being operated are stored in the memory 112 each time.

Moreover, writing data is input from the outside of the writing apparatus 100, and stored in the storage device 140. The writing data usually defines information on a plurality of figure patterns to be written. Specifically, it defines a pattern code, coordinates, size, etc. for each figure pattern.

FIG. 1 shows configuration elements necessary for describing the first embodiment. It should be understood that other configuration elements generally necessary for the writing apparatus 100 may also be included therein.

Figure 2:
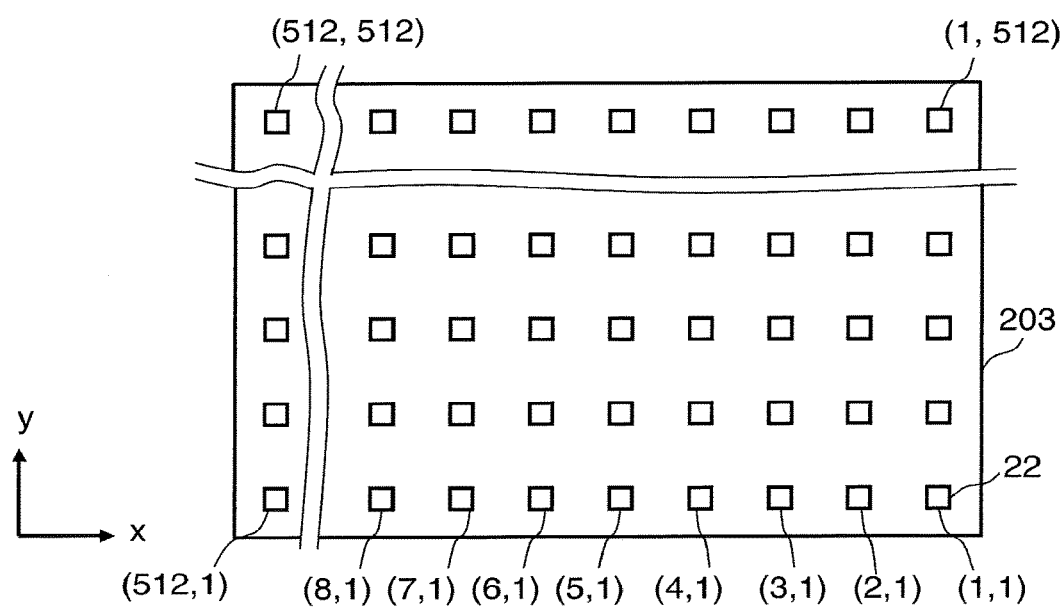
FIG. 2 is a conceptual diagram showing a structure of a shaping aperture array substrate according to the first embodiment.

FIG. 2 is a conceptual diagram showing a structure of a shaping aperture array substrate according to the first embodiment. As shown in FIG. 2, holes (openings) 22 of p rows long (y direction) and q columns wide (x direction) (p≥2, q≥2) are formed, like a matrix, at a predetermined arrangement pitch in the shaping aperture array substrate 203. In FIG. 2, for example, holes 22 of 512 (rows arrayed in the y direction)×512 (columns arrayed in the x direction) are formed. Each of the holes 22 is a quadrangle having the same dimension, shape, and size. Alternatively, each of the holes 22 may be a circle with the same diameter. The illumination lens 202 illuminates the region including the whole of a plurality of holes 22 of the shaping aperture array substrate 203 with the electron beam 200 emitted from the electron gun 201 (emission source). Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
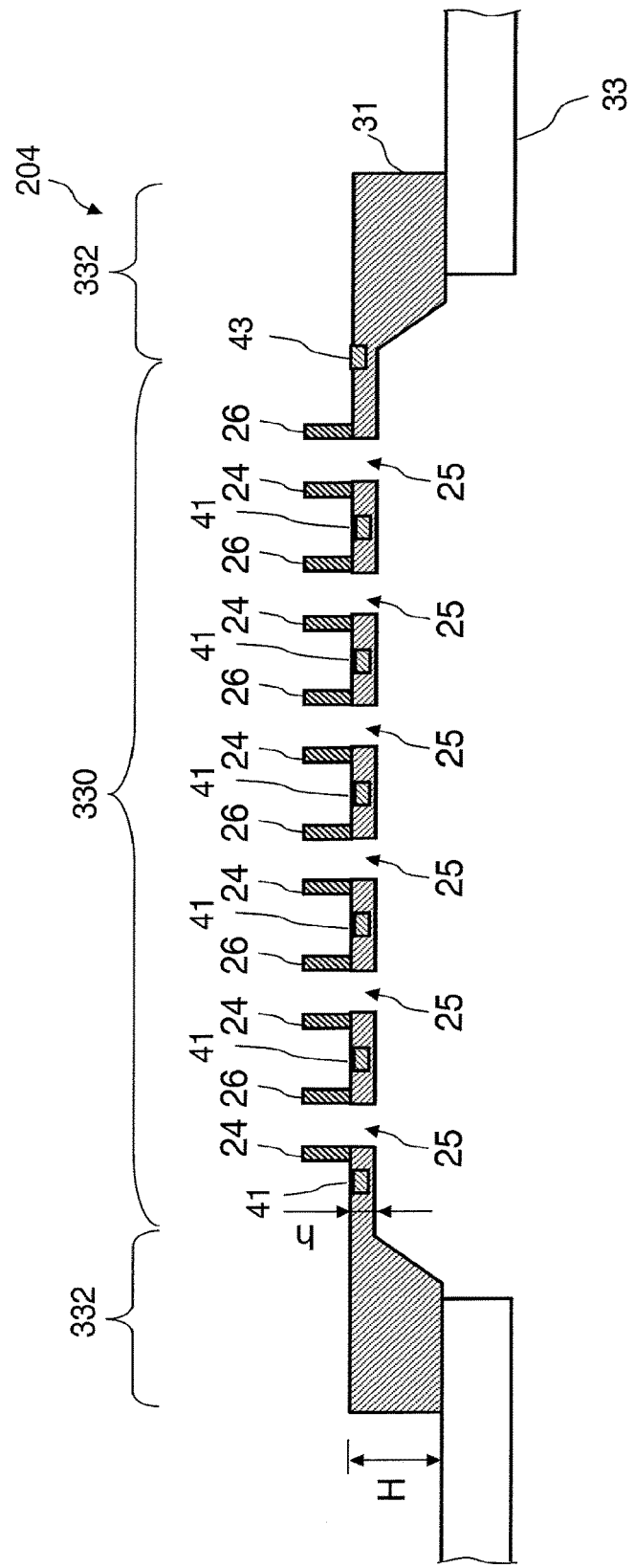
FIG. 3 is a sectional view showing the structure of a blanking aperture array mechanism according to the first embodiment.

FIG. 3 is a sectional view showing the structure of a blanking aperture array mechanism according to the first embodiment.

Figure 4:
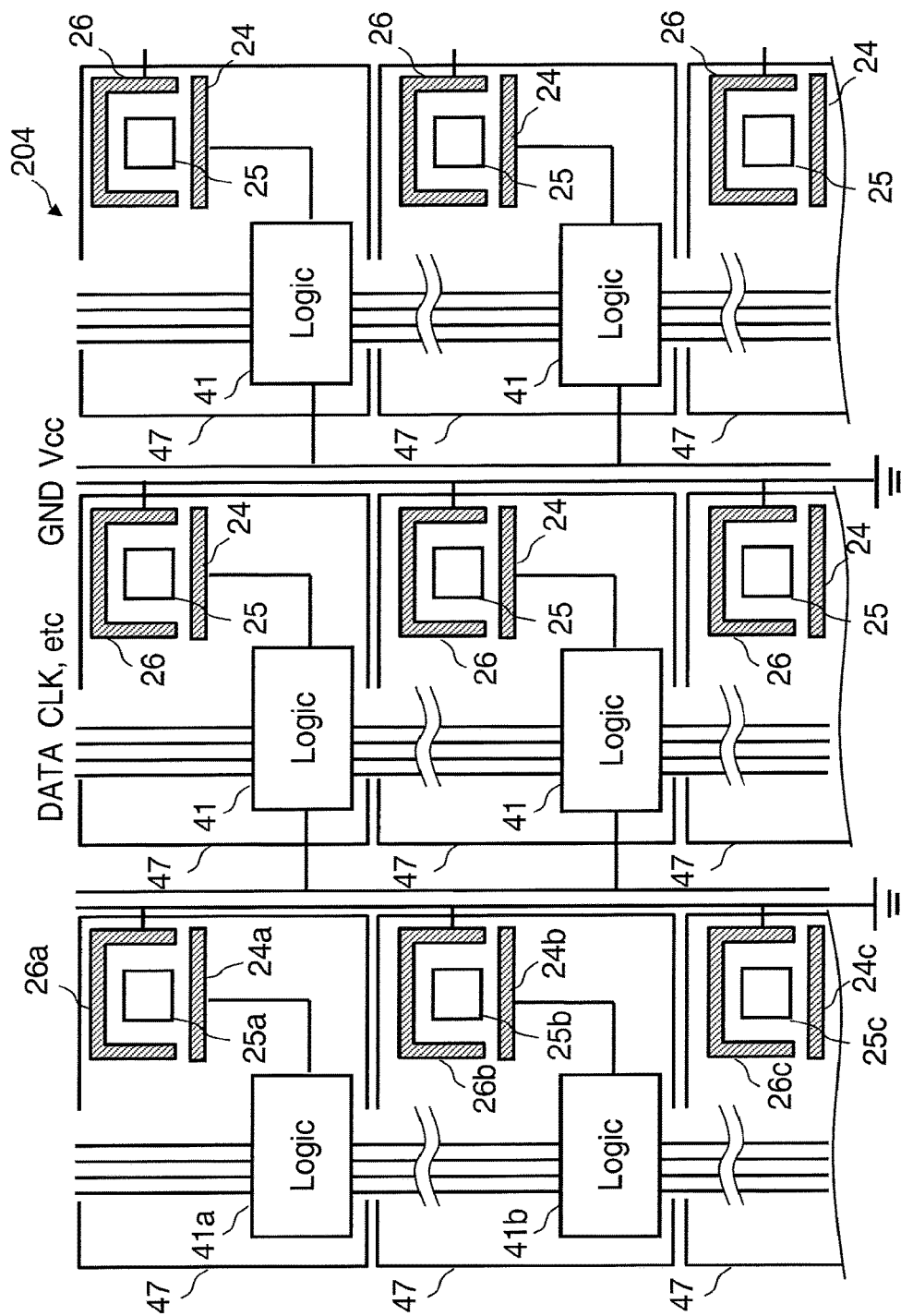
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. Between FIGS. 3 and 4, the positional relation among a control electrode 24, a counter electrode 26, a control circuit 41, and a pad 43 is not in accordance with each other. With regard to the structure of the blanking aperture array mechanism 204, as shown in FIG. 3, a semiconductor substrate 31 made of silicon, etc. is placed on a support table 333. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush in height with each other, or substantially flush in height with each other. At the back side of the circumferential region 332, the substrate 31 is supported on the support table 333. The central part of the support table 333 is open, and the membrane region 330 is located at the opening portion of the support table 333.

In the membrane region 330, there are formed passage holes 25 (openings), through each of which a corresponding one of multi-beams passes, at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multi-beams passes. Moreover, in the membrane region 330 of the substrate 31, a plurality of electrode pairs each composed of two electrodes arranged to be opposite each other with respect to a corresponding one of a plurality of passage holes 25. Specifically, in the membrane region 330, as shown in FIGS. 3 and 4, each pair of the control electrode 24 and the counter electrode 26 (blanker: blanking deflector) for blanking deflection is arranged close to a corresponding passage hole 25 in a manner such that the electrodes 24 and 26 are facing each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 1-bit) parallel lines for control signals are connected to each control circuit 41. In addition to the n-bit parallel lines for controlling signals, lines for a clock signal, read signal, shot signal, power supply, and the like are connected to each control circuit 41. A part of the parallel lines may be used as the lines for a clock signal, read signal, shot signal, power supply, and the like. An individual blanking mechanism 47 composed of the control electrode 24, the counter electrode 26, and the control circuit 41 is configured for each of the multi-beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped per row or per column, and the control circuits 41 in each group are connected in series as shown in FIG. 4. The pad 43 arranged for each group sends a signal to the control circuits 41 in the group concerned. Specifically, a shift register to be described later is arranged in each control circuit 41, and for example, shift registers in the control circuits for beams in the same row in p×q multiple beams, for example, are connected in series. For example, control signals for beams in the same row in the p×q multiple beams are transmitted in series. For example, a control signal for each beam is stored in a corresponding control circuit 41 by p clock signals.

Figure 5:
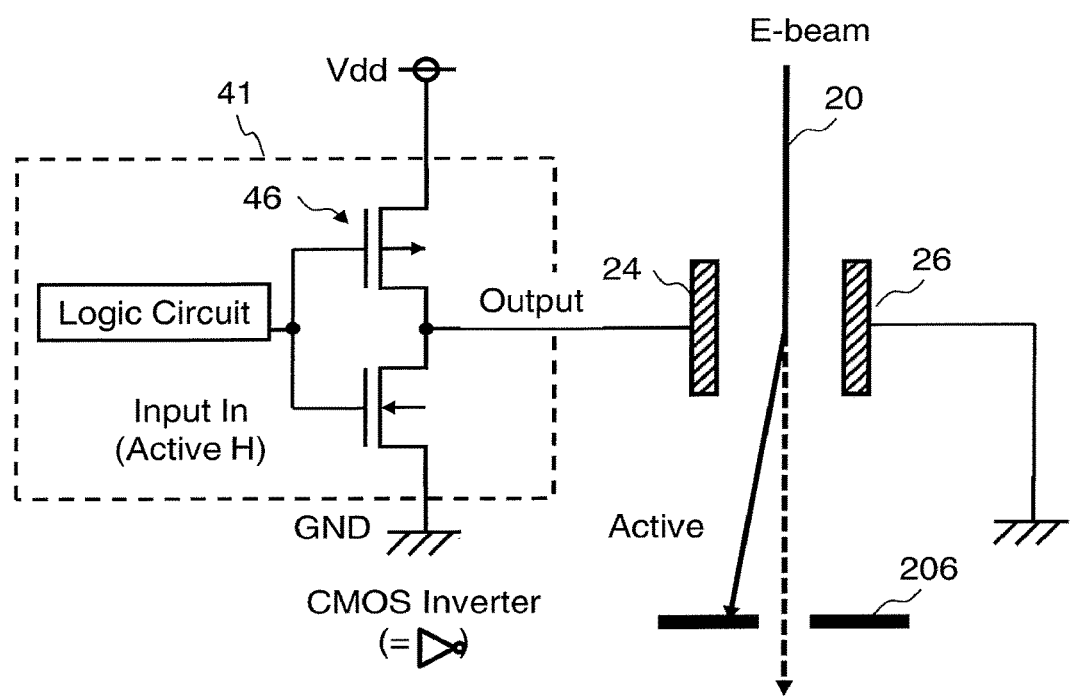
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that the control electrode 24 and the corresponding counter electrode 26 are opposite each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state (active state) where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby becoming in a beam OFF condition. On the other hand, in a state where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby becoming in a beam ON condition by letting the beam concerned pass through the limiting aperture substrate 206.

The electron beam 20 passing through a corresponding passage hole is deflected by a voltage independently applied to the control electrode 24 and the counter electrode 26 being a pair. Blanking control is performed by this deflection. Specifically, a pair of the control electrode 24 and the counter electrode 26 individually provides blanking deflection of a corresponding beam of multi-beams by an electric potential switched by the CMOS inverter circuit which serves as a corresponding switching circuit. Thus, each of a plurality of blankers performs blanking deflection of a corresponding beam in the multi-beams having passed through a plurality of holes 22 (openings) of the shaping aperture array substrate 203.

Figure 6:
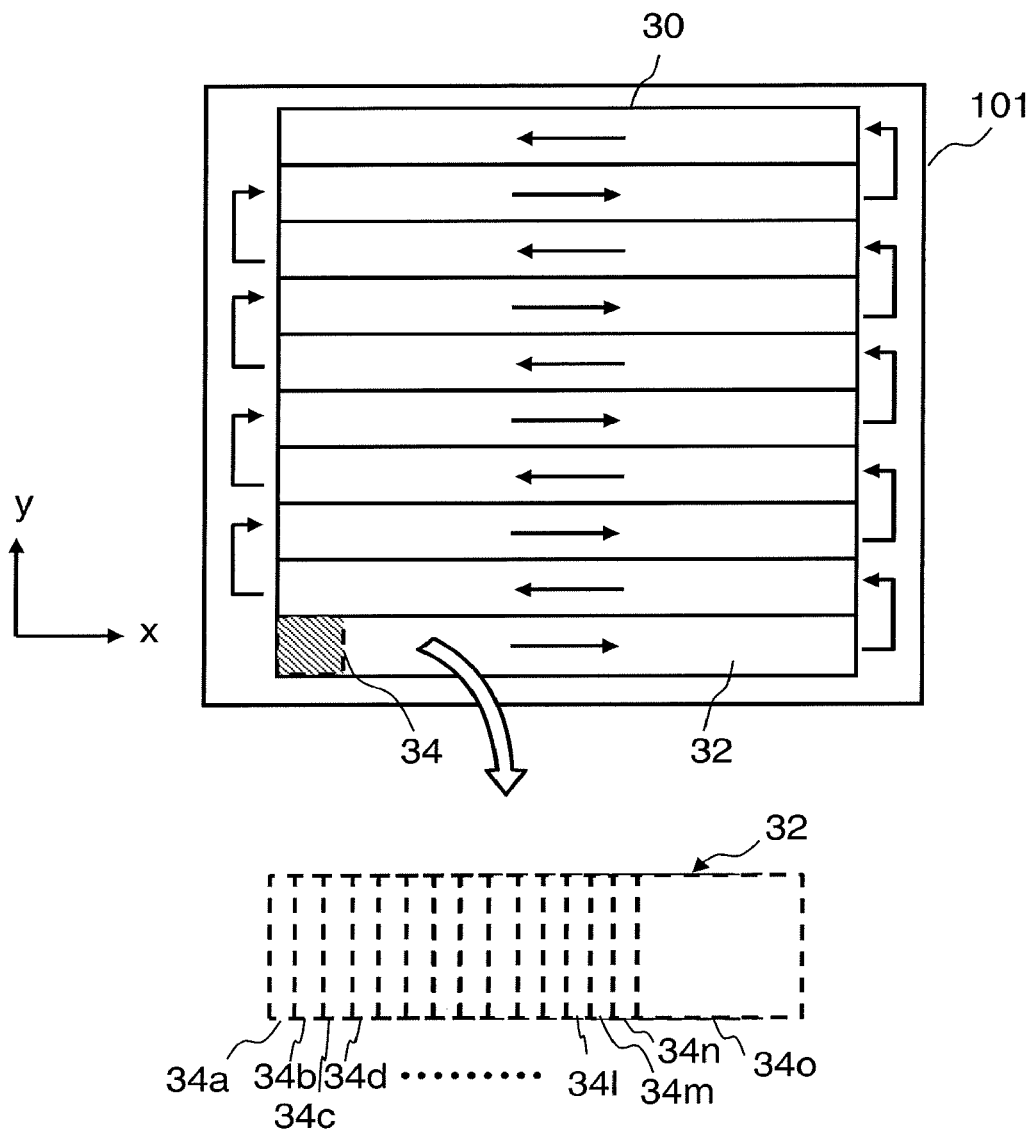
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position further left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to writing while alternately changing the direction, and it is also preferable to perform writing in the same direction when writing each stripe region 32. A plurality of shot patterns up to as many as the number of the holes 22 are formed at a time by one shot of multi-beams having been formed by passing through the holes 22 in the shaping aperture array substrate 203.

Figure 7:
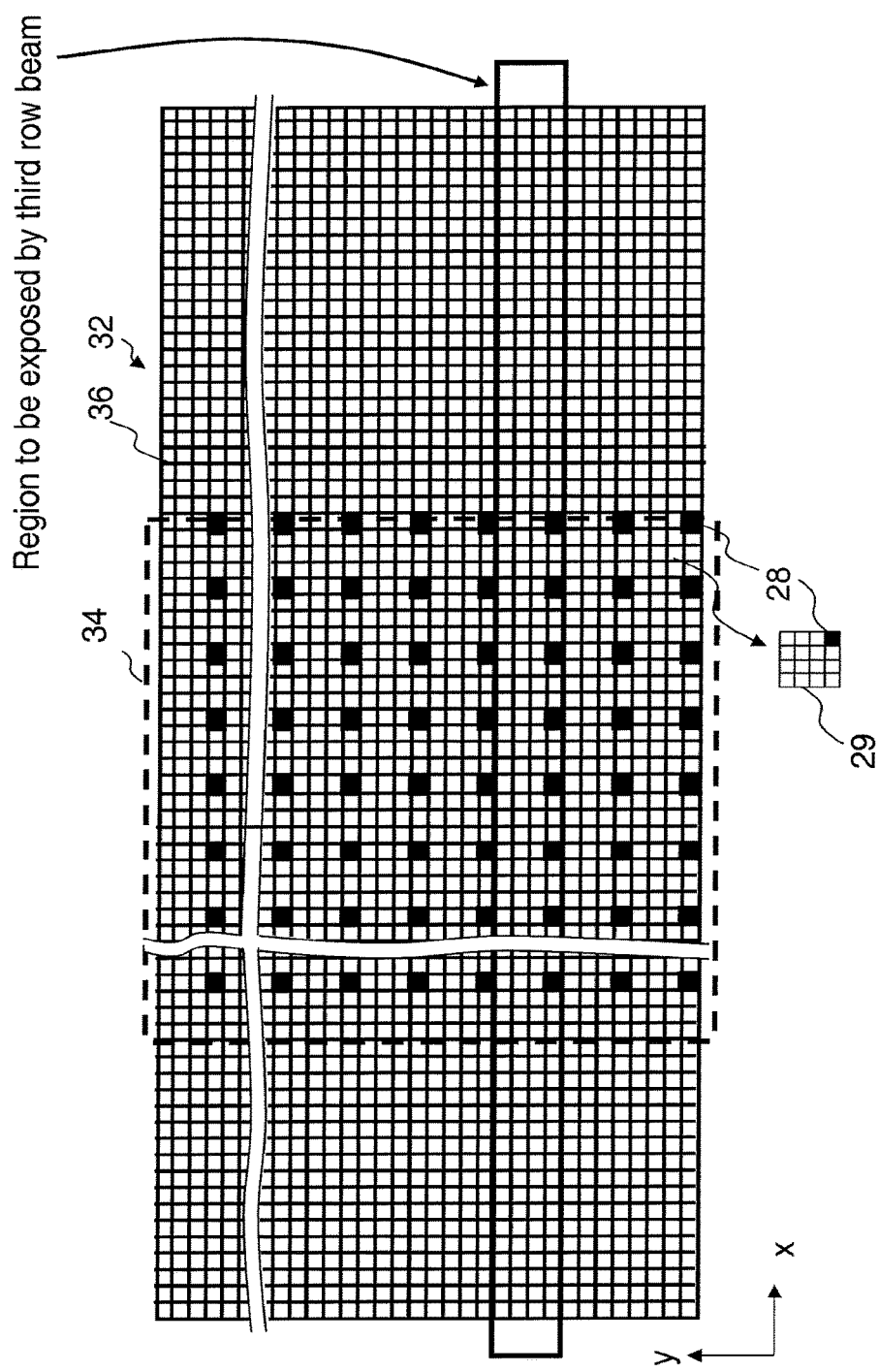
FIG. 7 shows an example of an irradiation region of multi-beams and a writing pixel according to the first embodiment.

FIG. 7 shows an example of an irradiation region of multi-beams and a pixel to be written (writing pixel) according to the first embodiment. In FIG. 7, the stripe region 32 is divided into a plurality of mesh regions by the size of each of the multi-beams, for example. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 20, for example. The width of the stripe region 32 is not limited to this. Preferably, the width of the stripe region 32 is n times (n being an integer of 1 or more) the size of the irradiation region 34. FIG. 7 shows the case of multi-beams of 512(rows)×512(columns) being simplified to 8×8. In the irradiation region 34, there are shown a plurality of pixels 28 (beam writing positions) which can be irradiated with one shot of the multi-beams 20. In other words, the pitch between the adjacent pixels 28 is the pitch between beams of the multi-beams. In the example of FIG. 7, one grid 29 is a square region surrounded by four adjacent pixels 28 at four corners and including one of the four pixels 28. In the example of FIG. 7, each grid 29 is configured by 4×4 pixels.

Figure 8:
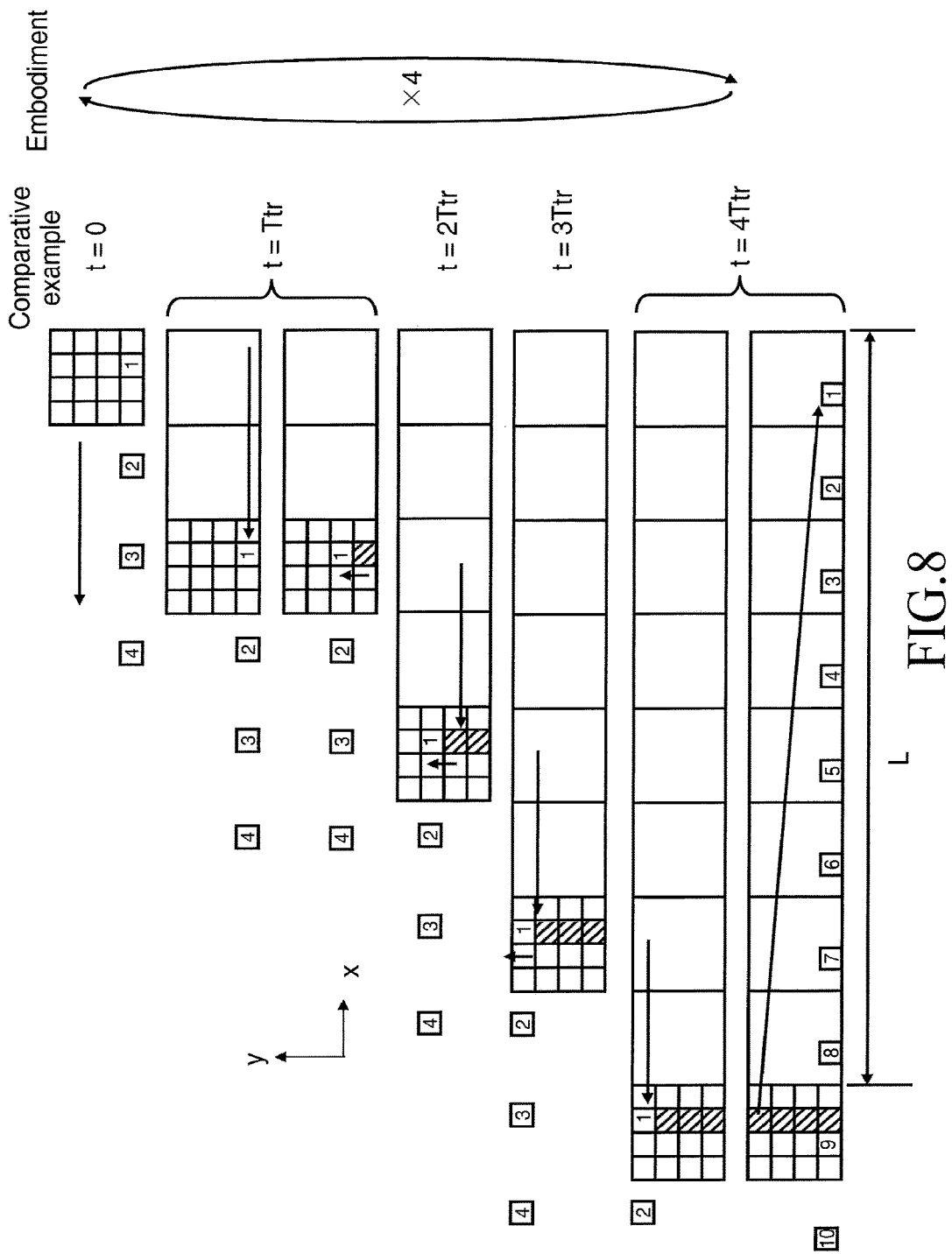
FIG. 8 illustrates an example of a writing method of multi-beams according to the first embodiment.

FIG. 8 illustrates an example of a writing method of multi-beams according to the first embodiment. FIG. 8 shows some grids to be written by respective beams at the coordinates (1, 3), (2, 3), (3, 3), . . . , (512, 3) in the third row from the bottom in the multi-beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a catoptric light from the mirror 210. The measured position of the XY stage 105 is output to the control computer 110. In the control computer 110, the writing control unit 80 outputs the position information on the XY stage 105 to the deflection control circuit 130. The deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 irradiates each pixel 36 with a corresponding beam in an ON condition in the multi-beams 20 during a writing time (irradiation time or exposure time) corresponding to each pixel 36 within a maximum irradiation time Ttr of the irradiation time of each of the multi-beams of the shot concerned. However, according to the first embodiment, a shot having the maximum irradiation time Ttr is divided into divided shots (sub shots: an example of a shot), by which a group is configured, each having a different one of a plurality of irradiation time periods. Then, a set of divided shots, where a sum of irradiation time periods has been selected to be equivalent to the writing time of the pixel 36 concerned from the group of the divided shots, is performed continuously or discontinuously.

FIG. 9 shows an example of divided shots of multi-beams according to the first embodiment. In FIG. 9, a maximum irradiation time Ttr of one shot to each pixel 36 is divided into n divided shots each having a different irradiation time and irradiating the same pixel 36. First, a gray-scale value Ntr is defined by dividing the maximum irradiation time Ttr by a quantization unit Δ (gray-scale value resolution). For example, when n=10, the maximum irradiation time Ttr is divided into ten divided shots. When the gray-scale value Ntr is defined by n-digit binary numbers, it is preferable to previously set the quantization unit Δ such that the gray-scale value Ntr is 1023 (Ntr=1023). By this, the maximum irradiation time Ttr is 1023Δ (Ttr=1023Δ). As shown in FIG. 9, each of the n divided shots has one of the irradiation time of $2^{k'}$ Δ where the digit number k' is one of 0 to 9 (k'=0 to 9). In other words, it has the irradiation time of one of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), and Δ(=$2^0$Δ). That is, one shot of multi-beams is divided into a divided shot with the irradiation time tk' of 512Δ, a divided shot with the irradiation time tk' of 256Δ, a divided shot with the irradiation time tk' of 128Δ, a divided shot with the irradiation time tk' of 64Δ, a divided shot with the irradiation time tk' of 32Δ, a divided shot with the irradiation time tk' of 16Δ, a divided shot with the irradiation time tk' of 8Δ, a divided shot with the irradiation time tk' of 4Δ, a divided shot with the irradiation time tk' of 2Δ, and a divided shot with the irradiation time tk' of Δ.

Therefore, an arbitrary irradiation time t (=NΔ) for irradiating each pixel 36 can be defined by a set having at least one of a group of divided shots each having a corresponding one of irradiation time periods each defined by 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), or Δ(=$2^0$Δ) except for the case of the irradiation time being zero.

Figure 10:
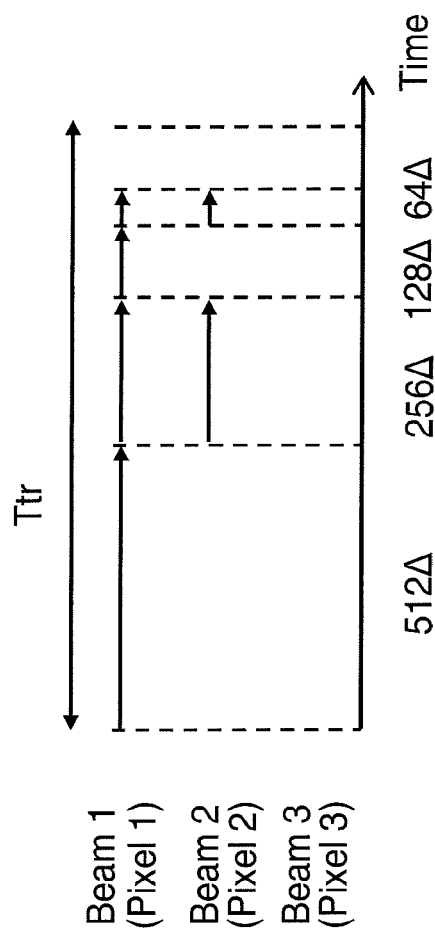
FIG. 10 shows an example of a set of divided shots according to the first embodiment.

FIG. 10 shows an example of a set of divided shots according to the first embodiment. In FIG. 10, for example, if a shot corresponding to N=960 is needed for pixel 1, since 960=$2^9$+$2^8$+$2^7$+$2^6$, a set of a divided shot with the irradiation time of $2^9$Δ, a divided shot with the irradiation time of $2^8$Δ, a divided shot with the irradiation time of $2^7$Δ, and a divided shot with the irradiation time of $2^6$Δ is to be selected. For example, if a shot corresponding to N=320 is needed for pixel 2, since 320=$2^8$+$2^6$, a set of a divided shot with the irradiation time of $2^8$Δ and a divided shot with the irradiation time of $2^6\Delta$ is to be selected. For example, if a shot corresponding to N=0 (no exposure) is needed for pixel 3, no divided shot is to be selected. In the case of converting the gray-scale value N of an arbitrary irradiation time t for irradiating each pixel 36 into a binary number, it is preferable to define to use a value of a large digit as large as possible.

Now, as a comparative example to the first embodiment, the operation of continuously performing each selected divided shot for each pixel 36 will be described.

In the example of FIG. 8, the second pixel from the right in the bottom row of the grid 29 concerned is irradiated with beams of a plurality of divided shots of the first shot of the beam (1) with coordinates (1, 3) during the time from t=0 to t=maximum irradiation time Ttr, for example. The beam (1) continuously performs divided shots selected for the pixel concerned during the time from t=0 to t=Ttr. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 8, when the time becomes t=Ttr, the pixel to be written (writing pixel) is shifted from the second pixel from the right in the bottom row of the grid 29 concerned to the second pixel from the right in the second row from the bottom. Since the XY stage 105 is moving at a fixed speed also during this time period, the tracking operation is continuously performed.

Then, while the tracking control is continued, respective corresponding beams in the ON condition in the multi-beams 20 are applied to shifted writing positions corresponding to the respective beams during a writing time corresponding to each of the respective beams within the maximum irradiation time Ttr of the shot concerned. In the example of FIG. 8, the second pixel from the right in the second row from the bottom of the grid 29 concerned is irradiated with the second shot of the beam (1) of coordinates (1, 3) during the time from t=Ttr to t=2Ttr, for example. The beam (1) continuously performs divided shots selected for the pixel concerned during the time from t=Ttr to t=2Ttr. Thereby, the pixel concerned has received beam irradiation of a desired irradiation time. The XY stage 105 moves two beam pitches in the −x direction during the time from t=Ttr to t=2Ttr, for example. During this time period, the tracking operation is continuously performed.

In the example of FIG. 8, when the time becomes t=2Ttr, the pixel to be written (writing pixel) is shifted from the second pixel from the right in the second row from the bottom of the grid 29 concerned to the second pixel from the right in the third row from the bottom. Since the XY stage 105 is moving also during this time period, the tracking operation is continuously performed. The second pixel from the right in the third row from the bottom of the grid 29 concerned is irradiated with a beam of the third shot of the beam (1) of coordinates (1, 3) during the time from t=2Ttr to t=3Ttr, for example. The beam (1) continuously performs divided shots selected for the pixel concerned during the time from t=2Ttr to t=3Ttr. Thereby, the pixel concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the pixel to be written (writing pixel) is shifted from the second pixel from the right in the third row from the bottom of the grid 29 concerned to the second pixel from the right in the fourth row from the bottom by collectively deflecting the multi-beams 20 by the deflector 209. Since the XY stage 105 is moving also during this time period, the tracking operation is continuously performed.

The second pixel from the right in the fourth row from the bottom of the grid 29 concerned is irradiated with a beam of the fourth shot of the beam (1) of coordinates (1, 3) during the time from t=3Ttr to t=4Ttr, for example. The beam (1) continuously performs divided shots selected for the pixel concerned during the time from t=3Ttr to t=4Ttr. Thereby, the pixel concerned has received beam irradiation of a desired irradiation time.

The XY stage 105 moves two beam pitches in the −x direction during the time from t=3Ttr to t=4Ttr, for example. During this time period, the tracking operation is continuously performed. In this manner, writing of the pixels in the second column from the right of the grid 29 has been completed.

In the example of FIG. 8, after emitting a corresponding beam to the writing position of each beam which has been shifted three times from the initial position, the DAC amplifier circuit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4Ttr, tracking of the grid 29 concerned is cancelled, and the beam is swung back to a new target grid which has been shifted by eight beam pitches in the x direction. Although the beam (1) of the coordinates (1,3) has been described in the example of FIG. 8, writing is also similarly performed for each grid corresponding to a beam of other coordinates. That is, a beam of coordinates (n, m) completes writing of pixels in the second column from the right of a corresponding grid when the time becomes t=4Ttr. For example, a beam (2) of coordinates (2,3) completes writing of pixels in the second column from the right of a grid adjacent in the −x direction to the grid 29 concerned for the beam (1) of FIG. 8.

Since writing of the pixels in the second column from the right of each grid has been completed, in a next tracking cycle after resetting the tracking, the deflector 209 performs deflection such that the writing position of each corresponding beam is adjusted (shifted) to the third pixel from the right in the first row from the bottom of each grid.

As described above, each shot is performed while shifting the irradiation position (the position to be irradiated) pixel by pixel by the deflector 209 in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 6, the first shot position is adjusted to the position shifted by one pixel, for example. Then, while performing a next tracking control, each shot is performed shifting the irradiation position pixel by pixel by the deflector 209. By repeating this operation during writing the stripe region 32, the position of the irradiation region 34 is shifted one by one, such as from 34a to 34o, to perform writing of the stripe region concerned.

Figure 11:
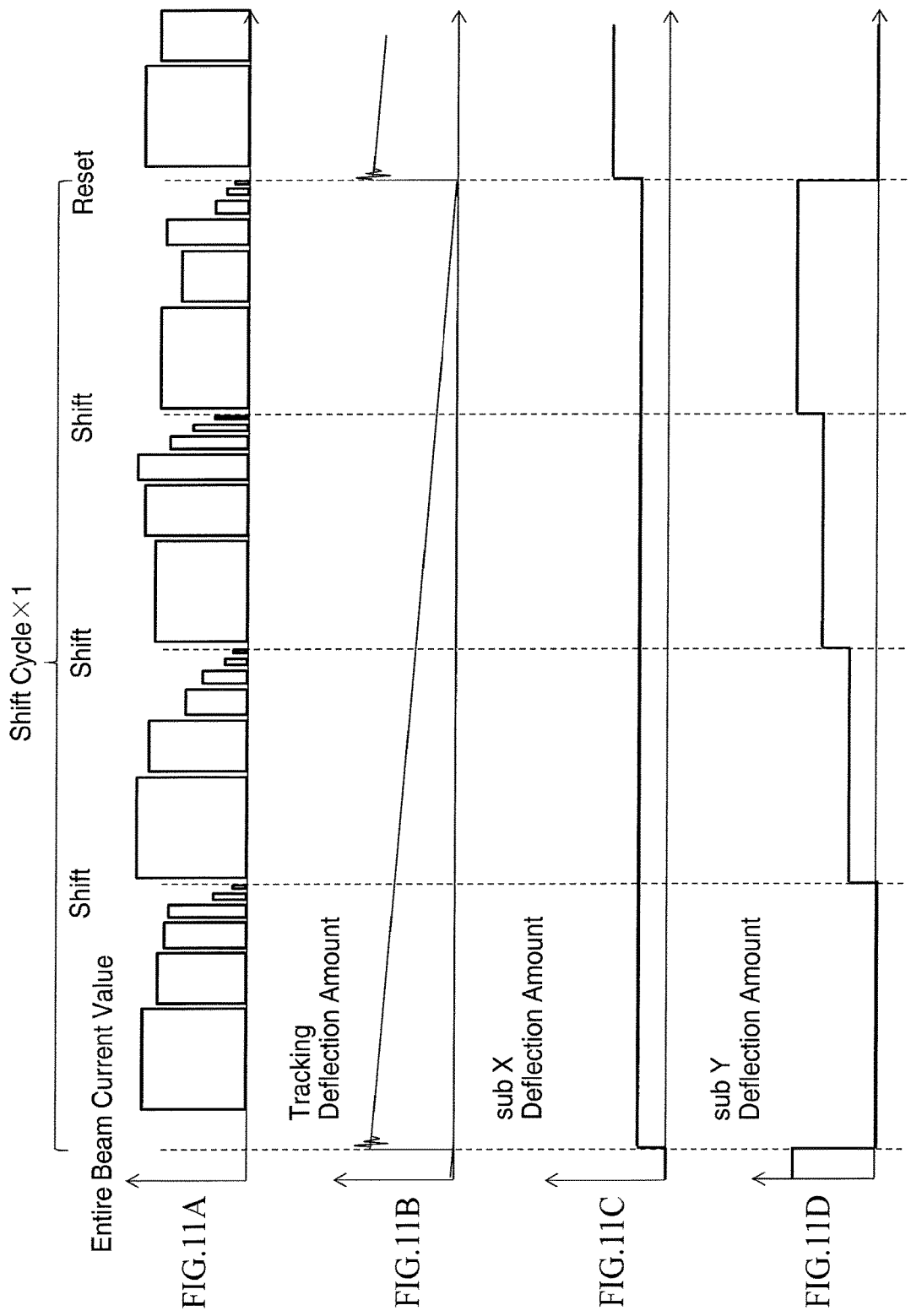
FIGS. 11A to 11D show an example of a time chart of tracking deflection and shift deflection according to a comparative example to the first embodiment.

FIGS. 11A to 11D show an example of a time chart of tracking deflection and shift deflection according to a comparative example to the first embodiment. As described above, in the comparative example to the first embodiment, after continuously performing divided shots selected for each pixel 36, it is shifted to a next pixel 36. At this time, as shown in FIG. 11B, the tracking operation is continued while the stage moves the distance L of FIG. 8. Therefore, in the case of FIG. 8, as shown in FIG. 11B, four pixels are exposed by performing one shift cycle, in which each beam shifts pixel by pixel in order from the first pixel to the fourth pixel as shown in FIG. 11A, in one tracking cycle. In the case of FIG. 8, since the shift direction in the same tracking is the y direction only, the deflection amount in the x direction by the deflector 209 is fixed in the same tracking as shown in FIG. 11C. On the other hand, the deflection amount in the y direction by the deflector 209 increases every shift deflection in the same tracking, as shown in FIG. 11D, for example. Note that FIG. 11A shows the current value magnitude of the entire multi-beams for each divided shot. Since it shows not a current amount but a current value defined by the electric charge amount per unit time, the abscissa axis represents the irradiation time. The current value does not vary during performing divided shots because there is emitted, by selected divided shots, only the beams corresponding to the irradiation time required for each pixel 36. However, as shown in FIG. 11A, according to this method, since the current value greatly varies depending on divided shots performed, focus deviation of the multi-beams 20 occurs because of the Coulomb effect. Therefore, preferably, the focus position should be corrected. However, since the amount of correction of the focus position is large compared to the movement amount (deflection amount) of the shift cycle to shift four pixels, it is difficult to control the DAC amplifier 137 by using a high-speed response characteristic equivalent to that of the DAC amplifier 132 of the deflector 209 which can perform shift deflection at high speed. The response characteristic of the DAC amplifier 137 becomes as slow as, for example, that of the DAC amplifier 134 of the deflector 208 which performs tracking deflection with a large deflection amount. Consequently, when correcting a focus position by the electrostatic lens 214, it is necessary to have, each time, a settling (stabilization) time of the DAC amplifier 137 whose response characteristic is relatively slow. Still more, when continuously irradiating the same pixel 36 by divided shots without deflection, if the focus position is corrected for each divided shot, since the settling time for a focus position is needed each time, the throughput significantly degrades.

Then, according to the first embodiment, the number of times of settling time generation can be substantially reduced by greatly decreasing the number of times of needing focus position correction as described below.

Figure 12:
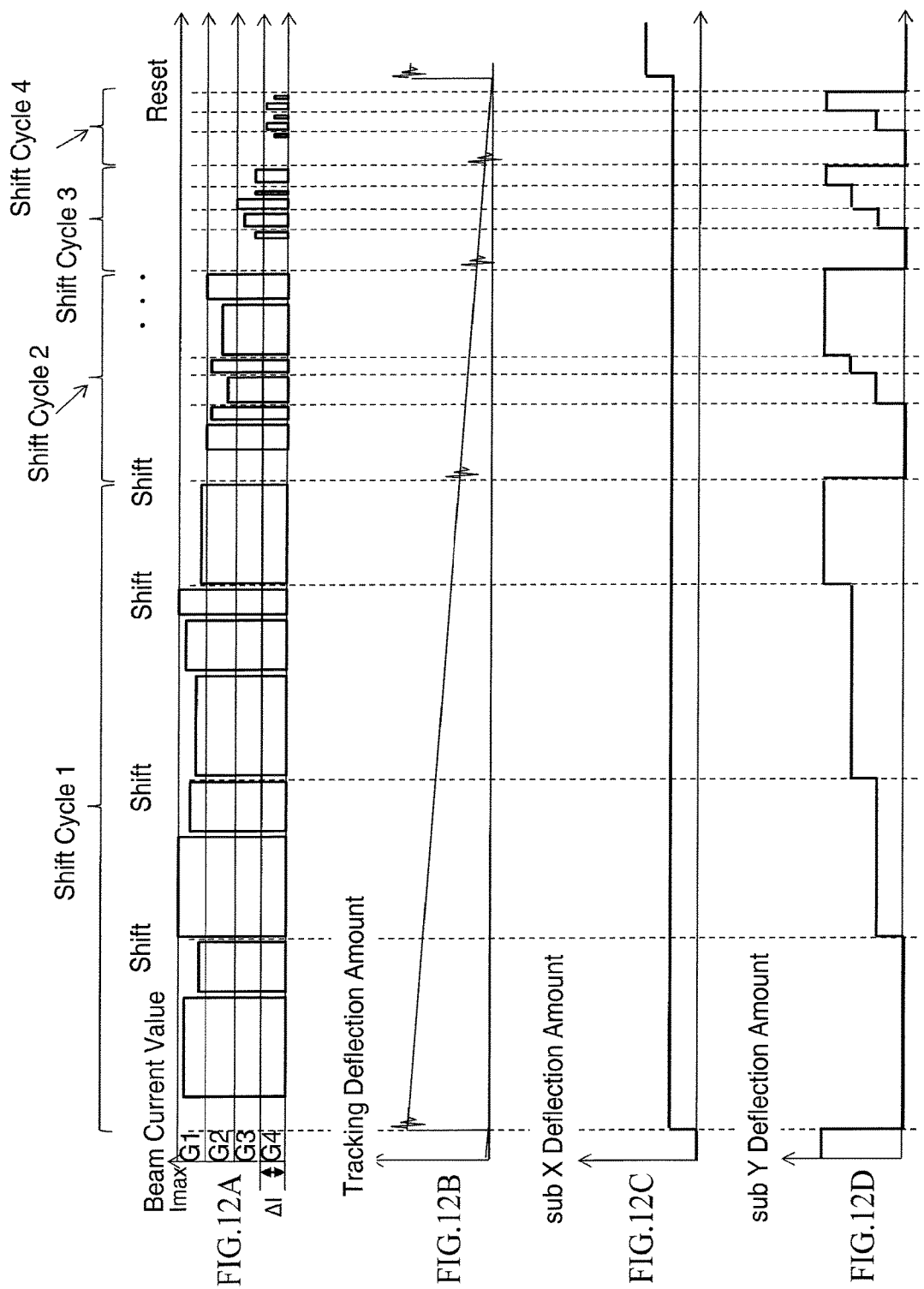
FIGS. 12A to 12D show another example of a time chart of tracking deflection and shift deflection according to the first embodiment.

FIGS. 12A to 12D show another example of a time chart of tracking deflection and shift deflection according to the first embodiment. In the first embodiment, when each beam irradiates m pixels 36 while performing shifting in one tacking cycle, and each pixel 36 (irradiation position) is irradiated with n divided shots, totally m×n divided shots (example of a shot) of multi-beams are performed. The m×n divided shots are grouped. Specifically, the current value of the entire ON beams in the divided shot concerned is calculated for each divided shot of the multi-beams. Moreover, a current value range (allowable range) ΔI is obtained by experiment previously which makes a focus deviation amount acceptable even when the current value varies. Moreover, a total current value (maximum current value) Imax in the case of all the beams of multi-beams becoming in the ON condition is calculated beforehand. Then, as shown in FIG. 12A, the maximum current value Imax is classified by the allowable range ΔI, and the class of each current value is regarded as a group for each allowable range ΔI. FIG. 12A shows four current value classes, obtained by dividing the maximum current value Imax of the entire multi-beams by the current value range ΔI, which are groups G1, G2, G3, and G4 from a larger current value to a smaller one, for example. FIGS. 12C and 12D show the cases where shifting is performed only in the y direction in one tracking cycle. Therefore, as shown in FIG. 12C, the deflection amount in the x direction by the deflector 209 is fixed in the same tracking. FIG. 12D shows the case where four pixels are exposed by one shift cycle in which each beam shifts pixel by pixel in order from the first pixel to the fourth pixel in the y direction by the deflector 209. Therefore, FIG. 12 shows the case where 4×10 divided shots (example of a shot) of multi-beams are performed during one tracking cycle. FIG. 12A shows not a current amount but a current value defined by the electric charge amount per unit time, and each divided shot range (abscissa axis) represents the irradiation time. In FIG. 12A, a divided shot less than or equal to 8Δ is not shown in the divided shots.

According to the first embodiment, with respect to m×n divided shots of the multi-beams 20, each divided shot is assigned to one of groups G1, G2, G3, and G4, where the assignment is performed depending on a total current value of beams becoming in the ON condition in the divided shot concerned in the multi-beams 20. Then, in the same group, divided shots are further sub-grouped, where the sub-grouping is performed depending on a deflection amount of shifting in the y direction. Thus, for each group, in the y direction, there are a subgroup of the first pixel, a subgroup of the second pixel, a subgroup of the third pixel, and a subgroup of the fourth pixel. It is needless to say that, depending on the total current value of divided shots, there may be a group or a subgroup in which no divided shot is performed.

First, in one tracking cycle, the focus position is adjusted for the group G1. During this state, with respect to the first pixel that is not shifted in the y direction, divided shots of multi-beams assigned to the group G1 are performed in order. Then, as shown in FIG. 12D, it is shifted in the y direction to the second pixel, and divided shots of multi-beams assigned to the group G1 are performed in order with respect to the second pixel shifted in the y direction. Similarly, with respect to the third and fourth pixels in the y direction, in order, shifting and divided shots of multi-beams are performed.

Then, in the same tracking cycle, the focus position is adjusted (corrected) for the group G2. During this state, with respect to the first pixel that is not shifted in the y direction, divided shots of multi-beams assigned to the group G2 are performed in order. Then, as shown in FIG. 12D, it is shifted in the y direction to the second pixel, and divided shots of multi-beams assigned to the group G2 are performed in order with respect to the second pixel shifted in the y direction. Similarly, with respect to the third and fourth pixels in the y direction, in order, shifting and divided shots of multi-beams are performed.

Next, in the same tracking cycle, the focus position is adjusted (corrected) for the group G3. During this state, with respect to the first pixel that is not shifted in the y direction, divided shots of multi-beams assigned to the group G3 are performed in order. Then, as shown in FIG. 12D, it is shifted in the y direction to the second pixel, and divided shots of multi-beams assigned to the group G3 are performed in order with respect to the second pixel shifted in the y direction. Similarly, with respect to the third and fourth pixels in the y direction, in order, shifting and divided shots of multi-beams are performed.

Next, in the same tracking cycle, the focus position is adjusted (corrected) for the group G4. During this state, with respect to the first pixel that is not shifted in the y direction, divided shots of multi-beams assigned to the group G4 are performed in order. Then, as shown in FIG. 12D, it is shifted in the y direction to the second pixel, and divided shots of multi-beams assigned to the group G4 are performed in order with respect to the second pixel shifted in the y direction. Similarly, with respect to the third and fourth pixels in the y direction, in order, shifting and divided shots of multi-beams are performed. In the examples of FIGS. 12A and 12D, there is no divided shot of the third pixel shifted in the y direction. In such a case, the pixel position where a divided shot does not exist may be omitted. Thus, while one tracking control is performed, a shift cycle in which the same beam of the multi-beams 20 irradiates a plurality of irradiation positions in order by collectively shifting the entire multi-beams is repeated as many times as the number of a plurality of groups.

With reference to the example of FIG. 8, the shift cycle for each group is performed during the time from t=0 to t=4Ttr. If there are K groups, the shift cycle is repeated K times. In the examples of FIG. 8 and FIGS. 12A to 12D, the shift cycle is repeated four times during the time from t=0 to t=4Ttr for one tracking cycle. At the beginning of the shift cycle, the focus position is corrected based on the current value of the group concerned. At the time of focus position correction, when immediately after changing the excitation rate of the lens for focus correction, there is a possibility of the position of the multi-beams on the target object being unstable. Therefore, preferably, shots are started after a predetermined time has passed since changing the excitation rate. By this structure, it is sufficient to perform, for each group, focus position adjustment associated with the difference of the current value, thereby significantly reducing the number of times of correction.

Figure 13:
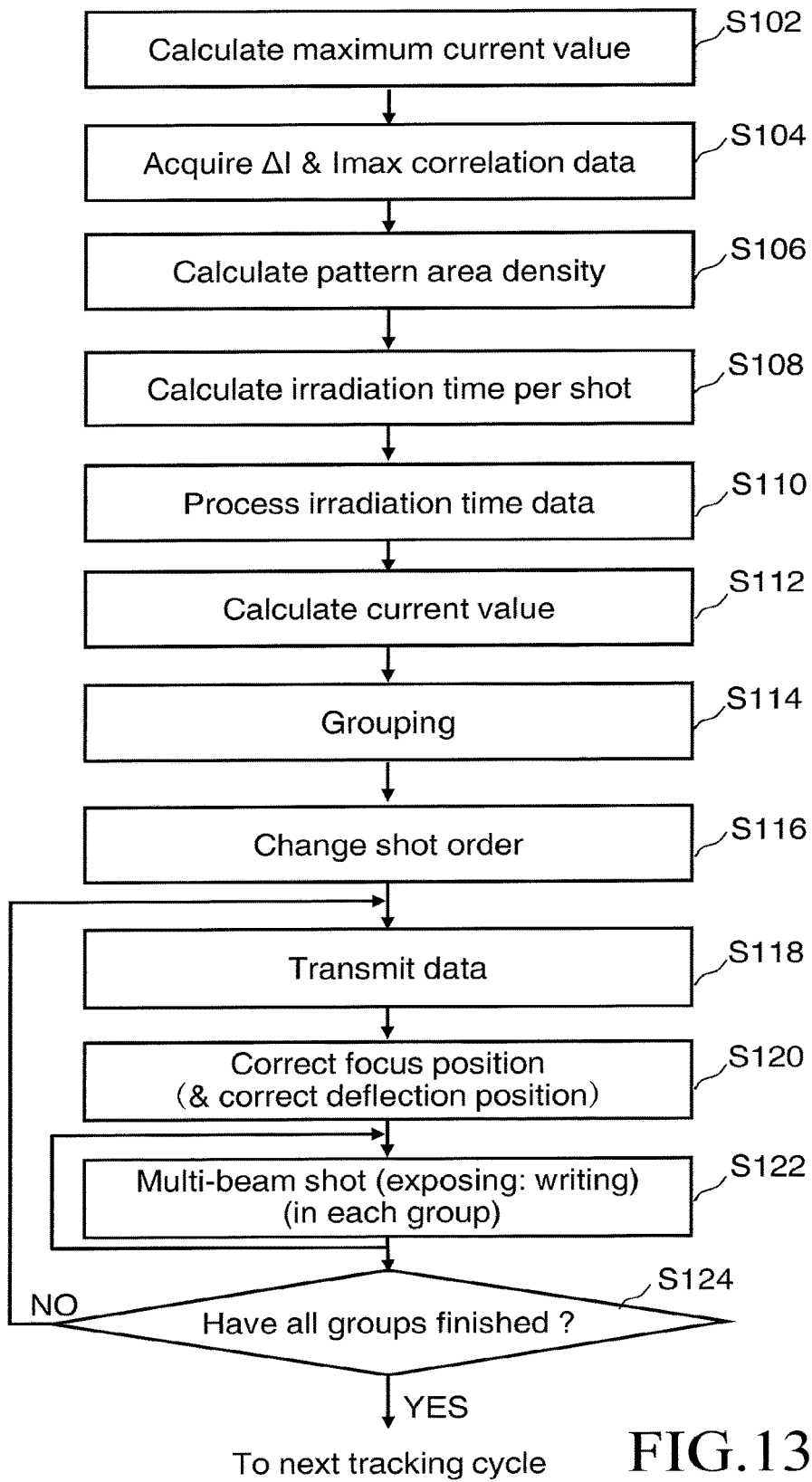
FIG. 13 is a flowchart showing main steps of a writing method according to the first embodiment.

FIG. 13 is a flowchart showing main steps of a writing method according to the first embodiment. In FIG. 13, the writing method (exposure method) of the first embodiment executes a series of steps: a maximum current value calculation step (S102), a gray-scale range and correlation data acquisition step (S104), a pattern area density calculation step (S106), an irradiation time per shot calculation step (S108), an irradiation time data processing step (S110), a current value calculation step (S112), a grouping step (S114), a shot order change step (S116), a data transmission step (S118), a focus position and deflection position correction step (S120), a multi-beam shot step (S122), and a determination step (S124).

In the maximum current value calculation step (S102), the maximum current value Imax calculation unit 68 calculates a total current value (maximum current value) Imax in the case of all the beams of the multi-beams 20 being in the ON condition. Assuming that the current value of each beam is substantially uniform, the total current value (maximum current value) Imax is calculated by multiplying the current value per beam by the number of beams. According to the first embodiment, a current value being a charge amount per unit time is used instead of a current amount. Thereby, a total current value can be calculated based on the number of beams irrespective of irradiation time. The current value per beam is to be set or measured in advance. Alternatively, it is also preferable to actually measure current values of all the beams by irradiating a Faraday cup (not shown).

In the gray-scale range and correlation data acquisition step (S104), a current value range (allowable range) $\Delta I$, within which a focus deviation amount is acceptable even when the current value varies, is obtained in advance by experiment. The allowable range $\Delta I$ is preferably set to be approximately equal to or less than the acceptable value of the field curvature aberration, for example. Regarding, as a division number, an integer (rounding up if a decimal place occurs) obtained by dividing the maximum current value Imax by the allowable range $\Delta I$, as shown in FIG. 12A, the maximum current value Imax is divided into a plurality of classes (G1 to G4) for each allowable range $\Delta I$. An amount $\Delta F$ of focus correction (amount of refocus) for each class is calculated in advance by experiment, etc. The refocus amount $\Delta F$ may be measured by using all the beams or measured based on a position deviation amount of an evaluation pattern written by using the center beam of the multi-beams 20, or the center beam and four edge beams. Focus correction (refocus) may be performed using the electrostatic lens 214.

FIG. 14 shows an example of correlation data according to the first embodiment. In FIG. 14, a plurality of classes (G1 to G4) for each allowable range $\Delta I$ are defined by $\Delta I'/Imax$ by using a change amount $\Delta I'(=Imax-It)$ from the maximum current value Imax. Since the case being divided into four classes (G1 to G4) is shown in the example of FIG. 12A, there are four classes: a class G1 (indicated by 0) of $0 \le (\Delta I'/Imax) < 0.25$, a class G2 (indicated by 0.25) of $0.25 \le (\Delta I'/Imax) < 0.5$, a class G3 (indicated by 0.5) of $0.5 \le (\Delta I'/Imax) < 0.75$, and a class G4 (indicated by 0.75) of $0.75 \le (\Delta I'/Imax) \le 1$. Then, the correlation between a class ($\Delta I'/Imax$) and a refocus amount $\Delta F$ is defined. FIG. 14 shows the case where focus setting (focusing) is performed with the maximum current value Imax, and this focus position is treated as a reference. In FIG. 14, an adjustment amount (A.U. unit) in the z direction (height-wise direction) is shown as an example of the refocus amount $\Delta F$. The beam position on the target object may be changed when a focus correction lens changes the trajectory of the multi-beams 20 by changing the excitation rate of the focus correction lens. Because of this change, the tracking position (deflection position of the multi-beams 20 by the deflector 208) may sometimes deviate on the surface of the target object 101. Therefore, amounts of position deviation in the x and y directions are measured for each refocus amount $\Delta F$. Using the data, as shown in FIG. 14, correlation data defining correlation among a class ($\Delta I'/Imax$), a refocus amount $\Delta F$, an x-direction position deviation $\Delta x$, and a y-direction position deviation $\Delta y$ is generated. The generated correlation data is input from the outside of the writing apparatus 100, and stored in the storage device 144. Also, information on the allowable range $\Delta I$ and the maximum current value Imax is input from the outside of the writing apparatus 100, and stored in the storage device 144.

The correlation data and the allowable range $\Delta I$ should be calculated in advance before performing writing processing. If changing specifications of beam currents in the writing apparatus 100, the correlation data and the allowable range $\Delta I$ are calculated each time, or if past similar data exists, such data may be used.

In the pattern area density calculation step (S106), the pattern area density $\rho$ calculation unit 60 reads writing data from the storage device 140, and calculates, for each pixel 36, a pattern area density ρ in the pixel 36 concerned.

In the irradiation time per shot calculation step (S108), first, the dose D calculation unit 62 calculates, for each pixel (writing pixel) 36, a dose D with which the pixel 36 concerned is irradiated. For example, the dose D can be calculated by multiplying a pre-set reference dose $D_{base}$ a proximity effect correction irradiation coefficient $D_p$, and a pattern area density p. Thus, it is preferable to obtain the dose D to be in proportion to a pattern area density calculated for each pixel 36. With respect to the proximity effect correction irradiation coefficient $D_p$, the writing region (here, for example, stripe region 32) is virtually divided into a plurality of proximity mesh regions (mesh regions for proximity effect correction calculation) by a predetermined size. The size of the proximity mesh region is preferably about ⅒ of the influence range of the proximity effect, such as about 1 μm. Then, writing data is read from the storage device 140, and, for each proximity mesh region, a pattern area density ρ' of a pattern arranged in the proximity mesh region concerned is calculated.

Next, the dose D calculation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density ρ'. Moreover, the correction model of the proximity effect correction irradiation coefficient $D_p$ and its calculation method may be the same as those used in the conventional single beam writing system.

Next, the irradiation time t calculation unit 64 calculates, for each pixel 36, an electron beam irradiation time t for making the calculated dose D incident on the pixel 36 concerned. The irradiation time t can be calculated by dividing the dose D by a current density J. Then, an irradiation time t map which defines the irradiation time t acquired for each pixel 36 is generated. The generated t map is stored in the storage device 142.

In the irradiation time data processing step (S110), the data processing unit 66 selects, for each pixel 36, a set of divided shots which is corresponding to the irradiation time t for the pixel 36 concerned, from a group of divided shots (shot group) corresponding to a plurality of pre-set exposure time periods shown in FIG. 9. If the irradiation time to the pixel 36 concerned is not zero, at least one divided shot is selected. When selecting a divided shot, it is preferable to start selection from a divided shot whose exposure time (irradiation time) is longer than others. The data processing unit 66 generates an ON/OFF signal (irradiation time data) in binary numbers, for example, so that selected divided shots may be identified. In the example of FIG. 9, for example, with respect to the pixel 36 whose irradiation time is 1023Δ, since all the divided shots are selected for the irradiation time data of the pixel concerned, it is "1111111111". Regarding the order of arrangement of the divided shots, it may be set as appropriate, however, it is preferable to define such that divided shots are arranged in descending order of the irradiation time. For example, if the pixel 36 needs an irradiation time of 960Δ, since $960=2^9+2^8+2^7+2^6$, a set of a divided shot with the irradiation time of $2^9\Delta$, a divided shot with the irradiation time of $2^8\Delta$, a divided shot with the irradiation time of $2^7\Delta$, and a divided shot with the irradiation time of $2^6\Delta$ is selected. Therefore, the irradiation time data of this pixel 36 is "1111000000".

In the current value calculation step (S112), the current value "It" calculation unit 70 calculates, for each shot of the multi-beams 20 (in this case, for each of a plurality of divided shots for each pixel), a total current value "It" of beams becoming in the ON condition in the divided shot concerned. According to the first embodiment, for each tracking cycle, the total current value "It" of each of a plurality of divided shots performed in the same tracking cycle is calculated. As described above, when each beam irradiates m pixels 36 while performing shifting in one tacking cycle, and each pixel 36 (irradiation position) is irradiated with n divided shots, totally m×n divided shots (example of a shot) of multi-beams are performed. The total current value "It" is calculated for the m×n divided shots.

In the grouping step (S114), with respect to a plurality of times of divided shots (an example of a shot) of the multi-beams 20 performed in the same tracking cycle, the assignment unit 72 assigns each divided shot to one of a plurality of classes (groups), depending on a total current value "It" of beams becoming in the ON condition in the divided shot concerned in the multi-beams. Since the class (group) of a current value is known referring to correlation data stored in the storage device 142, each divided shot should be assigned to a class (group) to which the total current value "It" of the beams in the ON condition belongs. In the case of FIG. 12A, each divided shot is assigned to one of the classes (groups) G1 to G4.

In the shot order change step (S116), with respect to a plurality of times of divided shots (an example of a shot) of the multi-beams 20 performed in the same tracking cycle, the shot order change unit 74 changes the order of the plurality of times of divided shots so that divided shots assigned to the same current value class (group) may be continuously emitted (or "performed") for each of the plurality of classes (groups). In the divided shots assigned to the class (group) of the same current value, there are divided shots for the first pixel, divided shots for the second pixel, divided shots for the third pixel, and divided shots for the fourth pixel in the shift cycle. Then, even in the same class (group), the order of shots is changed so that divided shots for irradiating the first pixel may be continuously emitted. Similarly, the order of shots is changed so that divided shots for irradiating the second pixel may be continuously emitted. Similarly, the order of shots is changed so that divided shots for irradiating the third pixel may be continuously emitted. Similarly, the order of shots is changed so that divided shots for irradiating the fourth pixel may be continuously emitted.

In the data transmission step (S118), the transmission unit 79 transmits irradiation time data to the deflection control circuit 130 in the order of shots. The deflection control circuit 130 outputs, for each divided shot, an ON/OFF control signal of each of the multi-beams 20 to the blanking aperture array mechanism 204 (blanking device). Specifically, the deflection control circuit 130 outputs, for each shot, an ON/OFF control signal to the control circuit 41 for each beam in the blanking aperture array mechanism 204.

In the focus position and deflection position correction step (S120), the refocus amount calculation unit 76 reads correlation data from the storage device 144, and calculates (acquires), for each class (group), a refocus amount ΔF for the class (group) concerned depending on the total current value. The calculated refocus amount ΔF is output to the lens control circuit 136. The lens control circuit 136 controls the electrostatic lens 214, and the electrostatic lens 214 (correction lens) corrects, for each group, the focus position of the multi-beams 20 to the focus correction position for the group concerned in accordance with a total current value. In the case of FIG. 14, when the divided shot belongs to the group G1, the refocus amount ΔF=0. When the divided shot belongs to the group G2, the refocus amount ΔF=0.5. Since it has been adjusted to the focus position (reference position) of the case of all the multi-beams 20 being in the ON condition (the case of the maximum current value Imax) by the objective lens 207, the electrostatic lens 214 may correct it to the focus position for each group.

Further, referring to correlation data, the position deviation correction amount calculation unit 78 calculates, for each group, a correction amount for correcting position deviation of the irradiation position caused by correcting the focus position of the multi-beams 20 to a focus correction position for the group concerned. Here, by correcting the tracking deflection position, position deviation of the final irradiation position is corrected. Specifically, referring to correlation data, the position deviation correction amount calculation unit 78 calculates (acquires) an x-direction position deviation amount Δx and a y-direction position deviation amount Δy corresponding to the group concerned. Then, an x-direction position deviation correction amount Δx' and a y-direction position deviation correction amount Δy' for correcting the above-described position deviation are calculated (acquired). Then, the calculated correction amount is output to the deflection control circuit 130, and a deflection voltage for tracking is added with a deflection voltage equivalent to the correction amount so as to be applied to the deflector 208. In other words, when performing a plurality of times of shots of the multi-beams 20, for each group, the deflection amount of the deflector 208 is added with a correction amount for correcting position deviation of the irradiation position caused by correcting the focus position of the multi-beams 20 to a focus correction position for the group concerned. In the case of FIG. 14, if a divided shot belongs to the group G1, since the refocus amount ΔF=0, correcting position deviation is unnecessary. However, if a divided shot belongs to one of the other groups, since the refocus amount ΔF is not zero (ΔF≠0), it is preferable to perform position deviation correction.

In the multi-beam shot step (S122), the writing mechanism 150 performs a plurality of times of divided shots (an example of a shot) of the multi-beams 20 so that shots assigned to the same group may be continuously emitted in the state where the focus position of the multi-beams 20 has been corrected to the focus correction position for the group concerned. Specifically, there is performed a divided shot for the first pixel of the shift cycle in divided shots assigned to the same current value class (group). If there are a plurality of divided shots for the first pixel, they are performed continuously. Then, the irradiation position (position to be irradiated) is shifted to the second pixel in the same shift cycle by the deflector 209. A divided shot for the second pixel in the shift cycle is performed. If there are a plurality of divided shots for the second pixel, they are performed continuously. When divided shots for the second pixel have been finished, or there is no divided shot for the second pixel, it can be shifted to the third pixel. Then, the irradiation position is shifted to the third pixel in the same shift cycle by the deflector 209. A divided shot for the third pixel in the shift cycle is performed. If there are a plurality of divided shots for the third pixel, they are performed continuously. When divided shots for the third pixel have been finished, or there is no divided shot for the third pixel, it can be shifted to the fourth pixel. Next, the irradiation position is shifted to the fourth pixel in the same shift cycle by the deflector 209. A divided shot for the fourth pixel in the shift cycle is performed. If there are a plurality of divided shots for the fourth pixel, they are performed continuously. When divided shots for the fourth pixel have been finished, or there is no divided shot for the fourth pixel, the first shift cycle is completed.

Figure 15:
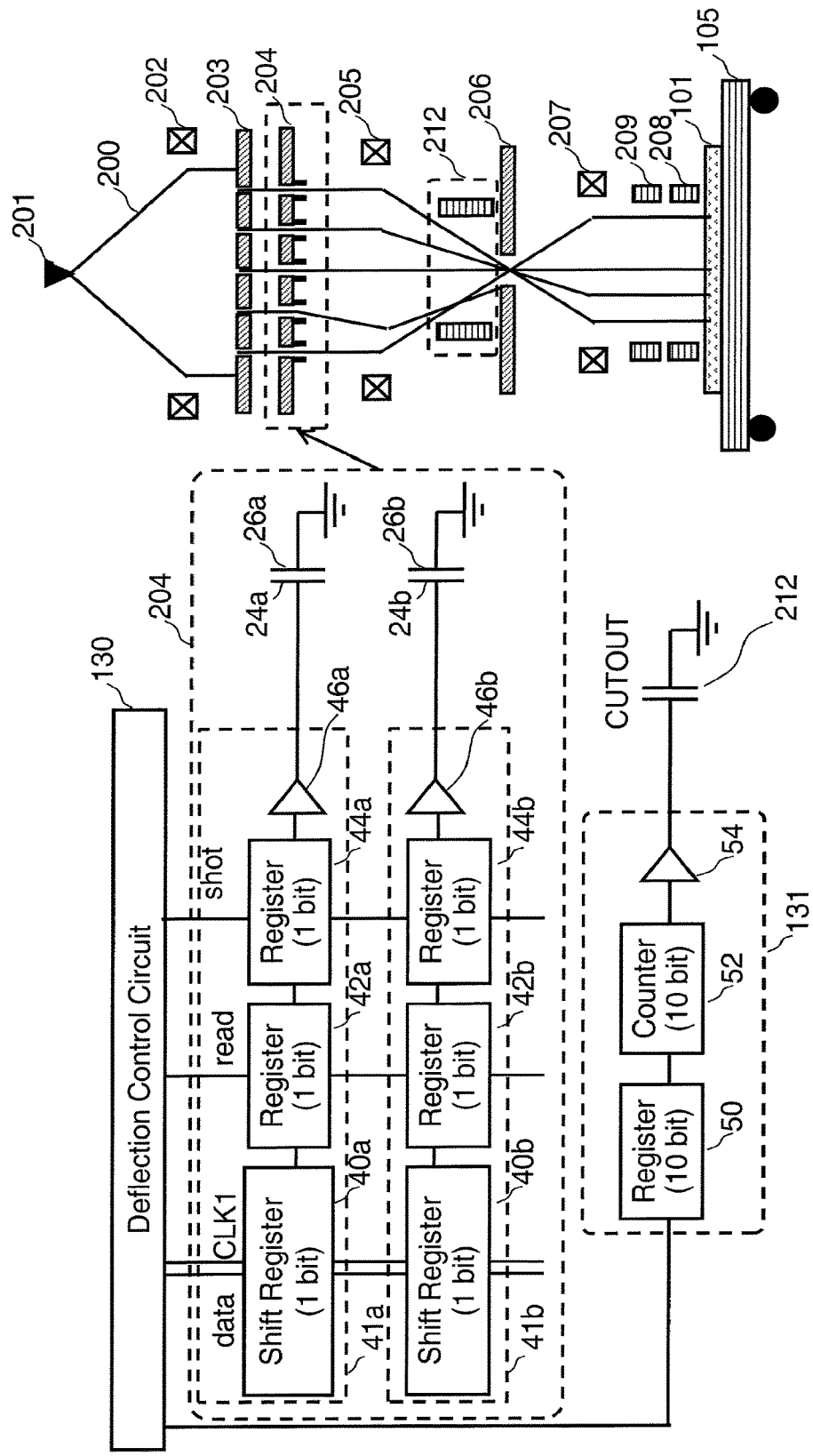
FIG. 15 is a conceptual diagram showing the internal configuration of an individual blanking control circuit and a common blanking control circuit according to the first embodiment.

FIG. 15 is a conceptual diagram showing the internal configuration of an individual blanking control circuit and a common blanking control circuit according to the first embodiment. As shown in FIG. 15, in each control circuit 41 for individual blanking control placed in the blanking aperture array mechanism 204 inside the body of the writing apparatus 100, there are arranged a shift register 40, a register 42, a register 44, and the amplifier 46. Individual blanking control for each beam is performed by a control signal (e.g., 1-bit). That is, for example, a 1-bit control signal is input/output to/from the shift register 40, the registers 42 and 44, and the amplifier 46. Since the amount of information of the control signal is small, the installation area of the control circuit can be made small. In other words, even when the control circuit is placed in the blanking aperture array mechanism 204 whose installation space is small, more beams can be arranged at a smaller beam pitch. This increases the amount of current passing through the blanking plate, and therefore, improves the writing throughput.

Moreover, in the logic circuit 131 for common blanking, there are arranged a register 50, a counter 52, and an amplifier 54. These do not simultaneously perform several different controls, and therefore, it is sufficient to use one circuit to perform ON/OFF control. Accordingly, even when arranging a circuit for a high speed response, no problem occurs with respect to restriction on the installation space and the current to be used in the circuit. Therefore, the amplifier 54 operates at very high speed compared to the amplifier 46 that can be implemented in the blanking aperture array mechanism 204. The amplifier 54 is controlled by a 10-bit control signal, for example. That is, for example, a 10-bit control signal is input/output to/from the register 50 and the counter 52.

According to the first embodiment, blanking control of each beam is performed by using both the beam ON/OFF control by each logic circuit 41 for individual blanking control described above and the beam ON/OFF control by the logic circuit 131 for common blanking control that collectively performs blanking control of the entire multi beams.

Figure 16:
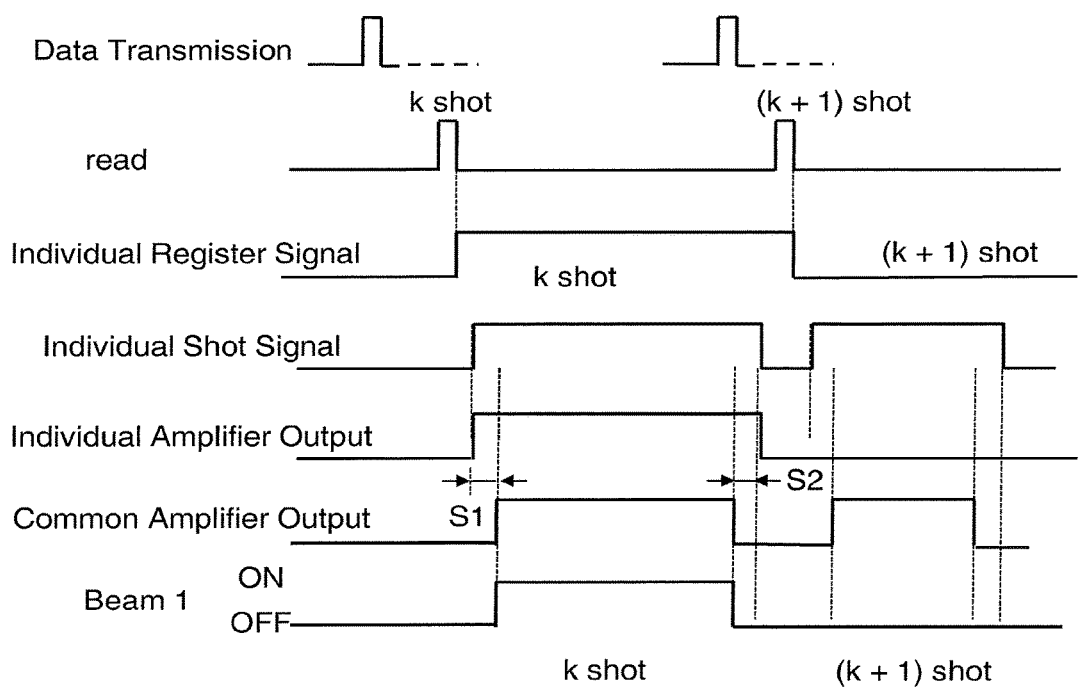
FIG. 16 is a timing chart showing a beam ON/OFF switching operation with respect to a divided shot according to the first embodiment.

FIG. 16 is a timing chart showing a beam ON/OFF switching operation with respect to a divided shot according to the first embodiment. FIG. 16 shows one beam (beam 1) in a plurality of beams configuring the multi-beams 20, for example. Here, the step of the k-th and the (k+1)th divided shots of the beam 1 is shown. In the irradiation time array data, for example, the k-th shot is indicated by "1", and the (k+1) th shot is indicated by "0".

The shift registers 40 in the control circuits 41 for beams in the same row, for example, in p×q multiple beams are connected in series. For example, irradiation time data (ON/OFF control signal) of divided shots of beams in the same row in p×q multiple beams are transmitted in series. Then, the transmitted irradiation time data of each beam is stored in a corresponding shift register 40 by p clock signals, for example.

Then, responsive to input of a read signal from the deflection control circuit 130, the individual register 42 reads and stores an ON/OFF signal, based on the stored k-th shot data (1 bit). Moreover, irradiation time data (10 bits) of the k-th shot is transmitted from the deflection control circuit 130, and stored in the register 50 for common blanking control.

Next, an individual shot signal of the k-th shot is output from the deflection control circuit 130 to the individual registers 44 of all the beams. Thereby, the individual register 44 for each beam maintains data stored in the individual register 42 only during the time of the individual shot signal being in the ON condition, and outputs a beam ON signal or a beam OFF signal to the individual amplifier 46 in accordance with a maintained ON/OFF signal. Instead of the individual shot signal, a load signal for keeping loading and a reset signal for resetting stored information may be output to the individual register 44. The individual amplifier 46 applies a beam ON voltage or a beam OFF voltage to the control electrode 24 in accordance with an input beam ON signal or beam OFF signal. On the other hand, after the individual shot signal, a common shot signal of the k-th shot is output from the deflection control circuit 130 to the counter 52 for common blanking control. The counter 52 performs counting only during the time indicated by the ON/OFF control signal stored in the register 50, and, during this period, outputs a beam ON signal to the common amplifier 54. The common amplifier 54 applies a beam ON voltage to the deflector 212 only during the time of inputting a beam ON signal from the counter 52.

Compared with ON/OFF switching of the individual blanking mechanism, a common blanking mechanism performs ON/OFF switching after a voltage stabilization time (settling time) S1/S2 of the amplifier 46 has passed. In the case of FIG. 16, after the individual amplifier has become ON and the settling time S1 of the individual amplifier 46 at switching from OFF to ON has passed, the common amplifier 54 becomes ON. Thereby, beam irradiation at an unstable voltage at the time of rise of the individual amplifier 46 can be avoided. Then, the common amplifier 54 becomes OFF after the irradiation time of the k-th shot being a target has passed. Consequently, in the case of both the individual amplifier 46 and the common amplifier 54 being in the ON condition, an actual beam becomes ON to irradiate the target object 101. Therefore, it is controlled such that the ON time period of the common amplifier 54 is the irradiation time of the actual beam. On the other hand, in the case of the common amplifier 54 becoming ON when the individual amplifier 46 is OFF, after the individual amplifier 46 becomes OFF and the settling time S2 of the individual amplifier 46 at switching from ON to OFF has passed, the common amplifier 54 becomes ON. Thereby, beam irradiation at an unstable voltage at the fall time of the individual amplifier 46 can be avoided.

As described above, by continuously performing divided shots in the same group in one tracking cycle, the shift cycle of the group concerned is carried out. Thus, since the focus position is corrected for each current value class (group), focus deviation occurring because of the Coulomb effect can be suppressed according to the first embodiment.

In the determination step (S124), the writing control unit 80 determines whether shots of all the current value classes (groups) in the same tracking cycle have been finished. If not finished yet, it returns to the data transmission step (S118), and repeats the steps from the data transmission step (S118) to the determination step (S124) until the shots of all the current value classes (groups) in the same tracking cycle have been finished. By this operation, the same number of shift cycles as the number of classes (groups) of the current value are performed in one tracking cycle, for example. In the examples of FIG. 8 and FIG. 12A to FIG. 12D, four shift cycles are performed while the focus position is corrected for each group in one tracking cycle. Therefore, by collectively shifting the entire multi-beams 20 by the deflector 209, the same pixel in a plurality of pixels (irradiation position) irradiated with each of the multi-beams 20 is irradiated with a corresponding beam in shots of a plurality of different groups in which focus positions of the multi-beams have been individually corrected. Moreover, by performing the same number of shift cycles as the number of classes (groups) of the current value, all the divided shots selected for the pixel 36 concerned in a group of divided shots corresponding to a plurality of pre-set exposure time periods can be emitted while changing the focus position. Therefore, beam irradiation with a desired irradiation time can be achieved. Meanwhile, the number of times of focus position correction can be reduced to the same number as that of classes (groups) of the current value.

Thus, according to the first embodiment, it is possible to suppress focus deviation occurring because of the Coulomb effect, while reducing degradation of the throughput of multi-beam writing.

Second Embodiment

Although the case of correcting the focus position by using the electrostatic lens 214 has been described in the first embodiment, it is not limited thereto. A second embodiment describes the case of using a deflector for deflecting an irradiation position.

Figure 17:
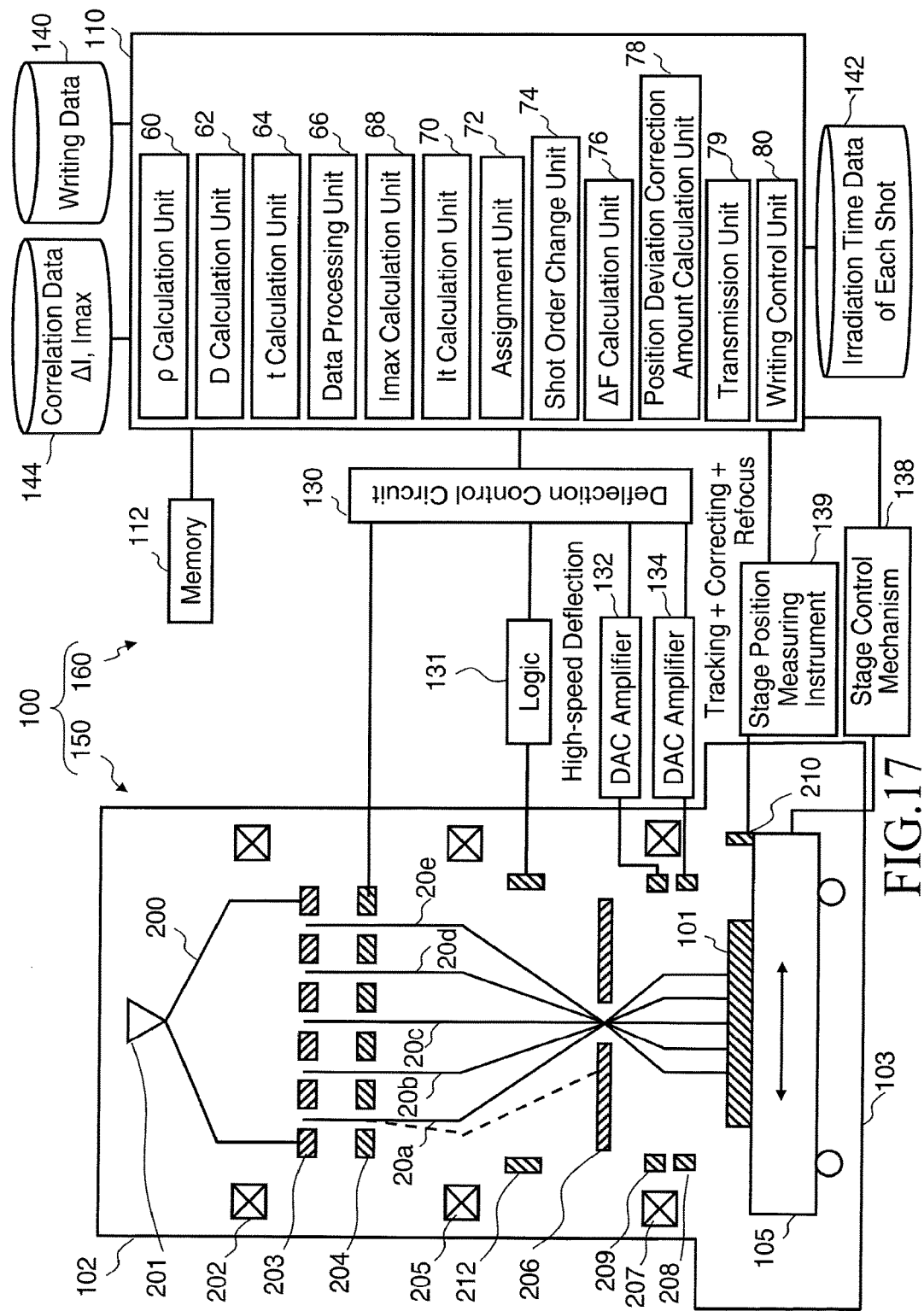
FIG. 17 is a conceptual diagram showing a structure of a writing apparatus according to a second embodiment.

FIG. 17 is a conceptual diagram showing a structure of a writing apparatus according to the second embodiment. FIG. 17 is the same as FIG. 1 except that the electrostatic lens 214, the lens control circuit 136, and the DAC amplifier circuit 137 are omitted. The contents of the present embodiment are the same as those of the first embodiment except for what is specifically described below.

According to the second embodiment, in the focus position and deflection position correction step (S120), the amount of correction of the focus position is added to the deflector 208. That is, the deflection control circuit 130 adds a deflection voltage equivalent to the correction amount for correcting a focus position to a deflection voltage for tracking and a deflection voltage corresponding to the correction amount for correcting a position deviation of the irradiation position due to focus position correction, and applies the added total voltage to the deflector 208. The deflector 208 is configured by, for example, octapole electrodes. When performing tracking control and positional deviation correction at the time of correcting the focus position, the voltage applied to each electrode differs depending on the direction desired to be deflected and the like, but when performing focus position correction, the same deflection voltage is applied to all the electrodes. Thereby, the number of parts in the electron optical column 102 can be reduced.

Thus, in the second embodiment, as in the first embodiment, it is possible to suppress focus deviation occurring because of the Coulomb effect, while reducing degradation of the throughput of multi-beam writing.

Embodiments have been explained referring to concrete examples described above. However, the present invention is not limited to these specific examples. While it has been described the case where a group of divided shots having mutually different exposure time periods is used, it is not limited thereto. Divided shots of the same exposure time may mixedly exist in the group of divided shots. Alternatively, the group of divided shots may be composed of only divided shots of the same exposure time.

While the apparatus structure, control method, and the like not directly necessary for explaining the present invention are not described, some or all of them can be selectively used case-by-case basis. For example, although description of the structure of the control circuit for controlling the writing apparatus 100 is omitted, it should be understood that some or all of the structure of the control circuit can be selected and used appropriately when necessary.

In addition, any other multi charged particle beam exposure method and multi charged particle beam exposure apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beams exposure method, comprising:
    assigning, to one of a plurality of groups of emitted beams, each shot among a plurality of times of shots of multi-beams by a charged particle beam, depending on a total current value of non-deflected beams in said each shot among the plurality of times of shots of the multi-beams;
    changing an order of the plurality of times of shots, so that shots assigned to a same group among the plurality of groups of emitted beams are continuously emitted for each group among the plurality of groups of emitted beams;
    correcting a focus position of the multi-beams to a focus correction position for said each group among the plurality of groups of emitted beams, based on the total current value; and
    emitting the plurality of times of shots of multi-beams, such that the shots assigned to the same group among the plurality of groups of emitted beams are continuously emitted in a state where the focus position of the multi-beams has been corrected to the focus correction position for said each group among the plurality of groups of emitted beams.

2. The method according to claim 1,
    wherein irradiation positions of the shots of multi-beams are controlled by a collective deflection of the shots of multi-beams by a deflector, and
    wherein, in emitting the plurality of times of shots of multi-beams, for said each group among the plurality of groups of emitted beams, a correction amount for correcting position deviations of the irradiation positions caused by the correcting the focus position of the multi-beams to the focus correction position for said each group among the plurality of groups of emitted beams is added to a deflection amount of the deflector.

3. The method according to claim 1,
    wherein each of irradiation positions of the shots of multi-beams is irradiated with a corresponding at least one shot among the plurality of times of shots of the multi-beams that is selected from a group of shots corresponding to a preset plurality of exposure time periods, and
    wherein a same irradiation position among the irradiation positions is irradiated with corresponding shots among the plurality of times of shots of the multi-beams from a plurality of different groups among the plurality of groups of emitted beams in which a focus position of the multi-beams has been individually corrected.

4. The method according to claim 3,
    wherein a deflection position of the shots among the plurality of times of shots of the multi-beams is controlled by tracking to follow movement of a stage, which moves continuously and on which a substrate to be exposed is placed, by a deflector, and
    wherein while a tracking-control is performed, the same irradiation position among the irradiation positions is irradiated with the corresponding shots among the plurality of times of shots of the multi-beams from the plurality of different groups among the plurality of groups of emitted beams in which the focus position of the multi-beams has been individually corrected.

5. The method according to claim 4, wherein, while the tracking-control is performed, performing a shift cycle in which a same beam of the multi-beams irradiates a plurality of irradiation positions in order by collectively shifting all of the multi-beams, the shift cycle being repeated as many times as a number of the plurality of groups.

6. The method according to claim 1,
    wherein a maximum current value in a case of all of the non-deflected beams is calculated in advance, the maximum current value being classified by an allowable range, and
    wherein a class of each current value of the allowable range is assigned to a group of emitted beams among the plurality of groups of the emitted beams.

7. A multi charged particle beams exposure apparatus, comprising:
    an emission source configured to emit a charged particle beam;
    a shaping aperture array substrate comprising a plurality of first openings, configured to form multi-beams upon irradiation of a region including the plurality of first openings by the charged particle beam, and through which portions of the charged particle beam individually pass;
    a blanking aperture array mechanism, including a substrate comprising a plurality of second openings and a plurality of electrodes, electrodes among the plurality of electrodes being arranged at the substrate so as to be opposite each other with respect to a corresponding opening among the plurality of second openings, the blanking aperture array mechanism being configured to individually perform blanking deflection for each beam of the multi-beams by using the plurality of electrodes;
    a limiting aperture substrate configured to block a beam of the multi-beams having been blanking-deflected;
    an objective lens configured to focus the multi-beams on a target object;
    an assignment circuit configured to assign, to one of a plurality of groups of emitted beams, each shot among a plurality of times of shots of the multi-beams, depending on a total current value of non-deflected beams in said each shot among the plurality of times of shots of the multi-beams;
    a shot order change circuit configured to change an order of the plurality of times of shots, so that shots assigned to a same group among the plurality of groups of emitted beams are continuously emitted for each group among the plurality of groups of emitted beams; and
    a correction lens configured to correct a focus position of the multi-beams to a focus correction position for said each group among the plurality of groups of emitted beams, based on the total current value, wherein the plurality of times of shots of the multi-beams are emitted such that the shots assigned to the same group among the plurality of groups of emitted beams are continuously emitted in a state where the focus position of the multi-beams has been corrected to the focus correction position for said each group among the plurality of groups of emitted beams.

8. The apparatus according to claim 7,
wherein a maximum current value in a case of all of the non-deflected beams is calculated in advance, the maximum current value being classified by an allowable range, and
wherein a class of each current value of the allowable range is assigned to a group of emitted beams among the plurality of groups of the emitted beams.

9. A multi charged particle beams exposure apparatus, comprising:
an emission source configured to emit a charged particle beam;
a shaping aperture array substrate comprising a plurality of first openings, configured to form multi-beams upon irradiation of a region including the plurality of first openings by the charged particle beam, and through which portions of the charged particle beam individually pass;
a blanking aperture array mechanism, including a substrate comprising a plurality of second openings and a plurality of electrodes, electrodes among the plurality of electrodes being arranged at the substrate so as to be opposite each other with respect to a corresponding opening among the plurality of second openings, the blanking aperture array mechanism being configured to individually perform blanking deflection for each beam of the multi-beams by using the plurality of electrodes;
a limiting aperture substrate configured to block a beam of the multi-beams having been blanking-deflected;
an objective lens configured to focus the multi-beams on a target object;
an assignment circuit configured to assign, to one of a plurality of groups of emitted beams, each shot among a plurality of times of shots of the multi-beams, depending on a total current value of non-deflected beams in said each shot among the plurality of times of shots of the multi-beams;
a shot order change circuit configured to change an order of the plurality of times of shots, so that shots assigned to a same group among the plurality of groups of emitted beams are continuously emitted for each group among the plurality of groups of emitted beams; and
a deflector configured to correct a focus position of the multi-beams to a focus correction position for said each group among the plurality of groups of emitted beams, based on the total current value, and to deflect the multi-beams,
wherein the plurality of times of shots of the multi-beams are emitted such that the shots assigned to the same group among the plurality of groups of emitted beams are continuously emitted in a state where the focus position of the multi-beams has been corrected to the focus correction position for said each group among the plurality of groups of emitted beams.

10. The apparatus according to claim 9,
wherein a maximum current value in a case of all of the non-deflected beams is calculated in advance, the maximum current value being classified by an allowable range, and
wherein a class of each current value of the allowable range is assigned to a group of emitted beams among the plurality of groups of the emitted beams.

* * * * *